(12) United States Patent
Sugawara et al.

(10) Patent No.: US 7,772,594 B2
(45) Date of Patent: Aug. 10, 2010

(54) HIGH-HEAT-RESISTIVE SEMICONDUCTOR DEVICE

(75) Inventors: Yoshitaka Sugawara, Osaka (JP); Yoshikazu Shoji, Tokyo (JP)

(73) Assignees: The Kansai Electric Power Co., Inc., Osaka-shi (JP); Adeka Corporation, Tokyo (JP)

( * ) Notice: Subject to any disclaimer, the term of this patent is extended or adjusted under 35 U.S.C. 154(b) by 381 days.

(21) Appl. No.: 11/661,778

(22) PCT Filed: Sep. 6, 2005

(86) PCT No.: PCT/JP2005/016319
§ 371 (c)(1),
(2), (4) Date: Dec. 6, 2007

(87) PCT Pub. No.: WO2006/028081
PCT Pub. Date: Mar. 16, 2006

(65) Prior Publication Data
US 2008/0210948 A1 Sep. 4, 2008

(30) Foreign Application Priority Data
Sep. 6, 2004 (JP) .............................. 2004-258673

(51) Int. Cl.
*H01L 29/12* (2006.01)
*C08G 77/12* (2006.01)
*C08G 77/20* (2006.01)

(52) U.S. Cl. .................. 257/76; 257/77; 257/E29.068; 528/31; 528/32

(58) Field of Classification Search .................. 257/76, 257/77
See application file for complete search history.

(56) References Cited

U.S. PATENT DOCUMENTS

| | | | | |
|---|---|---|---|---|
| 4,888,226 A | * | 12/1989 | Wong | 428/76 |
| 5,215,801 A | * | 6/1993 | Wong | 428/76 |
| 6,369,185 B1 | | 4/2002 | Amako et al. | |
| 6,417,019 B1 | * | 7/2002 | Mueller et al. | 438/29 |

(Continued)

FOREIGN PATENT DOCUMENTS

EP        0 444 960 A2     9/1991

(Continued)

OTHER PUBLICATIONS

Sugawara, et. al., *12-19kV 4H-SiC pin Diodes with Low Power Loss*, Proceedings of 2001 International Symposium on Power Semiconductor Devices & ICs, pp. 27-30.

(Continued)

*Primary Examiner*—Randy Gulakowski
*Assistant Examiner*—Robert Loewe
(74) *Attorney, Agent, or Firm*—Crowell & Moring LLP

(57) ABSTRACT

The outer surface of a wide-gap semiconductor device is coated with a synthetic polymer compound containing one or more silicon-containing polymer having a bridged structure formed by a siloxane (Si—O—Si bond structure). The synthetic polymer compound may include, for example, a silicon-containing polymer which has one or more reactive groups (A') selected from Si—$R^1$, Si—O—$R^2$ and Si—$R^3$—OCOC($R^4$)=$CH_2$, has a bridged structure formed by an Si—O—Si bond in one or more locations, and contains components having weight average molecular weights of not more than 1000 in an amount of 20% or less by weight.

10 Claims, 5 Drawing Sheets

U.S. PATENT DOCUMENTS

| | | |
|---|---|---|
| 6,744,194 B2 * | 6/2004 | Fukasawa et al. ............ 313/486 |
| 6,806,509 B2 * | 10/2004 | Yoshino et al. ............. 257/103 |
| 2004/0116640 A1 * | 6/2004 | Miyoshi ...................... 528/12 |
| 2004/0198924 A1 * | 10/2004 | Young et al. ................. 525/474 |
| 2005/0038221 A1 * | 2/2005 | Tabei et al. .................. 528/35 |
| 2005/0213926 A1 * | 9/2005 | Tabei et al. ................. 385/147 |
| 2005/0256286 A1 * | 11/2005 | Asch et al. .................... 528/31 |
| 2006/0081864 A1 * | 4/2006 | Nakazawa ................... 257/98 |

FOREIGN PATENT DOCUMENTS

| | | |
|---|---|---|
| EP | 444960 A2 * | 9/1991 |
| EP | 0 769 528 A2 | 4/1997 |
| JP | 3-252458 A | 11/1991 |
| JP | 3395456 B2 | 2/1996 |
| JP | 3409507 B2 | 12/1996 |
| JP | 9-169908 A | 6/1997 |
| JP | 2000-345046 A | 12/2000 |
| JP | 2001-2922 A | 1/2001 |
| JP | 2004-186168 A | 7/2004 |

OTHER PUBLICATIONS

International Search Report dated Dec. 6, 2005 with English translation (Four (4) pages).

* cited by examiner

HIGH-HEAT-RESISTIVE SEMICONDUCTOR DEVICE

TECHNICAL FIELD

The present invention relates to a semiconductor device having high heat resistance and high withstand voltage characteristics.

BACKGROUND ART

In the manufacture of semiconductor devices for use in the conversions of electric signal and electric power, silicon (hereinafter represented as "Si") semiconductor materials are used in general, and various improvements are being made to those semiconductor devices so that they can be used even in more hostile temperature environments. Examples of such semiconductor devices include semiconductor devices installed in artificial satellites and so on and used in space, and high-speed highly-integrated microprocessors installed in computers. And further, other examples of those devices include various power integrated circuits which control electric power above hundreds of milliwatts and various individual semiconductor devices such as IGBT etc. installed in automobile engine rooms. Furthermore, in various light-emitting semiconductor devices which emit light with various wavelengths, compound semiconductor materials are used. In these light-emitting semiconductor devices as well, there is a tendency to heighten current densities in order to achieve higher-intensity light emission, and therefore improvements are being made so that they can be used in hostile temperature environments in which higher bonding temperatures are used.

On the other hand, attention is being given to wide gap semiconductor materials such as silicon carbide (hereinafter represented as SiC) because they have excellent physical characteristics such as the facts that SiC is larger in energy gap than Si and is also higher in dielectric breakdown field strength by an order of magnitude. Wide gap semiconductor materials are materials suitable for the manufacture of power semiconductor devices used in even more hostile temperature environments, and semiconductor devices made of these materials are also being actively developed in recent years.

As an example of conventional high-heat-resistive high-withstand voltage power semiconductor devices using SiC, a power semiconductor device having a SiC diode element described below is disclosed in "Proceedings of 2001 International Symposium on Power Semiconductor Devices & IC's, pp. 27 to 30" (Conventional Art 1). In such a SiC diode element, a pn junction, from which electric charges are injected onto a SiC substrate, is formed by using an epitaxial film produced by an epitaxial growth technique. After the epitaxial film in the end region of the substrate has been removed by means of mesa etching, a termination portion for use in electric field relief is formed by means of ion implantation. Specifically, a 0.7-μm-thick p-type epitaxial layer is removed in a mesa etching process using a depth of about 1 μm, and then a 0.4-μm-thick film made of an inorganic substance such as silicon dioxide is formed as a passivation film. In this conventional art, the SiC diode element with a high withstand voltage of 12 to 19 kV can be produced.

FIG. 5 is a cross-sectional view of a SiC diode device fabricated by housing the above conventional SiC diode element in a package. In FIG. 5, on the top surface of a metal support 93 having a cathode terminal 92 on its under surface, the SiC diode element 90 is attached through its cathode electrode 97. To the support 93, an anode terminal 91 is further provided so as to penetrate the support 93 in a state of being electrically insulated from the support 93 by an insulator 12. The anode terminal 91 is connected to the anode electrode 96 of the SiC diode element 90 via a lead wire 8. On the top surface of the support 93, a metal cap 94 is provided so as to cover the diode element 90, with which a space 95 in the package including the diode element 90 is sealed. The space 95 is filled with a sulfur hexafluoride gas. In the case where the filling is conducted by using the sulfur hexafluoride gas, a coverture 100, which is represented as a mountain-shaped substance of FIG. 5 and will be described later, is not provided.

The reason why the filling is conducted by using the sulfur hexafluoride gas will be set forth below. Since the creeping distance between the anode electrode 96 and the exposed sides 90a of the element 90 not covered with the passivation film 98 is short, discharging is readily brought about in air, and therefore its withstand voltage cannot be increased. In order to increase the withstand voltage, the package is filled with the sulfur hexafluoride gas which is least apt to cause discharging in a high electric field as an insulating gas. In cases where inert gases such as nitrogen gas and noble gases such as argon gas are used as insulating gases, these gases are lower than sulfur hexafluoride gas in maximum dielectric breakdown field, and thus discharging is brought about in the gasses at the time of the application of high voltages. As a result, the SiC diode element 90 itself and the passivation film 98 made of silicon dioxide or the like are damaged. Therefore, in order to increase the withstand voltage, the filling is conducted by using the sulfur hexafluoride gas extremely stable even at a high temperature of about 150° C. to prevent discharging and dielectric breakdown.

Patent Reference 1: Japanese Patent No. 3395456
Patent Reference 2: Japanese Patent No. 3409507
Non-Patent Reference 1: Proceedings of 2001 International Symposium on Power Semiconductor Devices & IC's, pp. 27 to 30

DISCLOSURE OF THE INVENTION

Problems that the Invention is to Solve

Sulfur hexafluoride gas has extremely excellent insulating properties as insulating gas at present; however, since it contains fluorine, there is a need to avoid its use in terms of the prevention of global warming. In particular, in order to achieve high insulating properties, there is a need to hold the pressures of sulfur hexafluoride gases in semiconductor devices at a pressure of about 2 atmospheres at ordinary temperature. When temperatures rise during the use of semiconductor devices, the pressures rise above a pressure of 2 atmospheres; because of this, there are the dangers of explosions and gas leakage when the packages of semiconductor devices are not rugged so much. Wide gap semiconductor devices are sometimes operated at high temperatures of about 500° C. and in those cases, the pressures of sulfur hexafluoride gases considerably rise due to their thermal expansion, which causes problems such as the fact that the dangers of explosions of and gas leakage from packages further increase and then withstand voltages decrease due to the thermal decomposition of sulfur hexafluoride gases.

As conventional materials with excellent insulating properties other than sulfur hexafluoride gas, synthetic high molecular compounds containing polymethylphenylsiloxane with a linear structure formed by a siloxane (Si—O—Si bond structure) and synthetic high molecular compounds containing polyphenylsilsesquioxane with a bridged structure formed by a siloxane are used; the former is called silicon rubber (Si rubber) in general. At a temperature below 150° C., high insulating properties can be held by covering the entire the semiconductor element (diode element 90) with the coverture 100 made of the above synthetic high molecular compound as shown in FIG. 5.

Although the heat resistance of polymethylphenylsiloxane is not high so much, there is no problem when used at a junction temperature below 150° C. in a case where Si power semiconductor elements are used. However, when used at a high temperature above 200° C. in a case where semiconductor elements made of SiC as a wide gap semiconductor material are used, it cannot be said that the heat resistance of such siloxane is sufficiently high. When the temperatures of SiC semiconductor elements exceed 200° C. during use, the flexibility of covertures made of polymethylphenylsiloxane becomes poor. And further, when their temperatures exceed 250° C. in air, the covertures become rigid through vitrification. Because of this, the temperatures of SiC semiconductor elements return to room temperature, many cracks appear in the covertures made of polymethylphenylsiloxane. Furthermore, when semiconductor elements covered with polymethylphenylsiloxane are operated at a high temperature for many hours in an atmosphere of an inert gas such as a sulfur hexafluoride gas, voids and cracks appear near the surfaces of the elements because their weights are reduced. It is surmised that the reason why they appear is that methyl groups and phenyl groups on the side chains of polymethylphenylsiloxane decompose and evaporate. When voids and cracks appear, the surfaces of the elements cannot be sufficiently protected, and thus leakage currents increase. Moreover, the passivation films of the elements may become damaged at the time of the appearance of cracks, thereby the leakage currents substantially increase and the semiconductor elements may be broken. As described above, polymethylphenylsiloxane has the disadvantage that although it has good heat resistance at low temperatures, the function is lost at high temperatures.

On the other hand, although excellent in heat resistance, polyphenylsilsesquioxane is brittle and is apt to crack, thereby it is difficult to form a thick film through the use of such material. When used, polyphenylsilsesquioxane is applied onto the surfaces of elements in a thickness of several microns. However, the thickness of several microns makes it impossible to achieve a sufficient withstand voltage and hence, it has been difficult to use polyphenylsilsesquioxane in the manufacture of semiconductor devices having a high withstand voltage above 3 kV.

An object of the present invention is to provide a high-withstand voltage high-heat-resistive semiconductor device in which a semiconductor element is covered with a synthetic high molecular compound which is a silicon-containing curable composition having excellent heat resistance and flexibility.

Means for Solving the Problems

A semiconductor device according to the present invention is characterized in that at least one semiconductor element is provided and the semiconductor elements and at least a part of electrical connecting portions for use in electrically connecting the semiconductor elements to external devices are covered with a synthetic high molecular compound.

The synthetic high molecular compound is characterized in that the compound is a cured product prepared by heat-curing a silicon-containing curable composition which contains at least one of silicon-containing polymers as components (A), (B), and (C) described below and which contains a catalyst as component (D) described below.

Component (A) is a silicon-containing polymer which has one or more reactive groups (A') selected from the group consisting of the formulas Si—$R^1$, Si—O—$R^2$, and Si—$R^3$—OCOC($R^4$)=$CH_2$, has bridged structures formed by Si—O—Si bonds at one location or more, and contains components having weight-average molecular weights of not more than 1,000 at a content of not more than 20 wt % [$R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group].

Component (B) is a silicon-containing polymer which has Si—H groups, has bridged structures formed by Si—O—Si bonds at one location or more, and contains components having weight-average molecular weights of not more than 1,000 at a content of not more than 20 wt %.

Component (C) is a silicon-containing polymer which has one ore more reactive groups (A') selected from the group consisting of the formulas Si—$R^1$, Si—O—$R^2$, and Si—$R^3$—OCOC($R^4$)=$CH_2$, has Si—H groups, has bridged structures formed by Si—O—Si bonds at one location or more, and contains components having weight-average molecular weights of not more than 1,000 in content of not more than 20 wt %.

Component (D) is a curing catalyst as a platinum catalyst.

When not containing component (C), the silicon-containing curable composition contains components (A) and (B) and preferably contains component (D).

As the silicon-containing curable composition, a composition which contains components (A), (C), and (D) but does not contain component (B) or a composition which contains components (B), (C), and (D) but does not contain component (A) can be used.

As the silicon-containing curable composition, a composition which contains components (C) and (D) but does not contain components (A) and (B) can be used.

The high-heat-resistive semiconductor device according to the present invention includes at least one semiconductor element and has a structure in which the semiconductor elements and at least a part of the electrically connecting portions for use in electrically connecting the semiconductor elements to the external devices are covered with a synthetic high molecular compound prepared by heat-curing the silicon-containing curable composition which is characterized in that the total content of the aryl groups and arylene groups of a silicon-containing polymer composed of components (A), (B), and (C) contained in the silicon-containing curable composition is 0.1 to 50 wt %.

Furthermore, the semiconductor elements and at least a part of the electrical connecting portions for use in electrically connecting the semiconductor elements to the external devices are covered with a synthetic high molecular compound prepared by heat-curing the silicon-containing curable composition which contains a fine metal oxide powder as component (E).

The synthetic high molecular compound has high insulating properties, i.e., high withstand voltage characteristics and has an extremely high affinity for inorganic substance films such as silicon dioxide films and silicon nitride films used as the passivation films of semiconductor elements, and therefore the compound firmly adheres to the surface of a passivation film. Moreover, the synthetic high molecular compound also has an extremely high affinity for Si semiconductors and wide gap semiconductors such as SiC and GaN themselves and thus has excellent adhesive properties that the compound firmly adheres to the surfaces of the semiconductor elements.

A semiconductor device, which includes a semiconductor element covered with the synthetic high molecular compound having excellent adhesive properties, has high moisture resistance, and thus the high-reliability semiconductor device can be realized. The synthetic high molecular compound has an extremely high affinity for Si semiconductors and wide gap semiconductors such as SiC and GaN. Because of this, for example, even when defective portions such as pinholes are present in a passivation film and a semiconductor layer is exposed, the synthetic high molecular compound acts as a passivation film which directly protects the surface of the semiconductor element, thereby a high degree of reliability can be achieved.

The synthetic high molecular compound prepared by heat-curing the silicon-containing curable composition according to the invention has extremely excellent adhesive properties to inorganic substances, various metals such as copper, aluminum, and stainless steel, various resins such as epoxy resin, acrylic resin, and phenolic resin, various glasses, and so on used as passivation films, and the compound firmly adheres to these materials. On account of this, the surface protection film made of the synthetic high molecular compound also firmly adheres to the metal electrodes, electrically connecting portions, support, and so on of a semiconductor element without the occurrence of any gaps. As a consequence, high moisture resistance can be achieved and the semiconductor device having high reliability and high withstand voltage characteristics can be produced.

The synthetic high molecular compound obtained by heat-curing the silicon-containing curable composition according to the invention has high transmittancy against ultraviolet rays and visible rays. Because of this, conditions at a time when the synthetic high molecular compound is applied to the semiconductor elements and the electrical connecting portions can be visually checked. For example, the application step can be effectively executed while visually checking for the nonoccurrence of bubbles, voids, and so on.

In a compound light-emitting semiconductor device, a compound photocoupled semiconductor device, a wide gap light-emitting power semiconductor device, and a wide gap photocoupled power semiconductor device each using the synthetic high molecular compound obtained by heat-curing the silicon-containing curable composition according to the invention, both high-temperature high-withstand voltage functions by which their semiconductor elements can be protected even at high temperatures and high-efficiency photocoupling functions by which light can pass therethrough even at high temperatures can be simultaneously fulfilled.

ADVANTAGE OF THE INVENTION

According to the present invention, at least the top surface and sides of a semiconductor element included in a semiconductor device are covered with a synthetic high molecular compound obtained by heat-curing a silicon-containing curable composition. The synthetic high molecular compound has excellent withstand voltage characteristics even at high temperatures and has an extremely high affinity for semiconductor materials and inorganic substance films such as silicon dioxide film and silicon nitride film used as the passivation film of the element. On account of this, the synthetic high molecular compound firmly adheres to the surface of the element of the semiconductor device, and therefore the moisture-resistance of the semiconductor device can be heightened. Since the compound does not deteriorate even at high temperatures, particularly reliable high-withstand voltage characteristics can be achieved in a case where the semiconductor device is operated at high temperatures.

Figure 1:
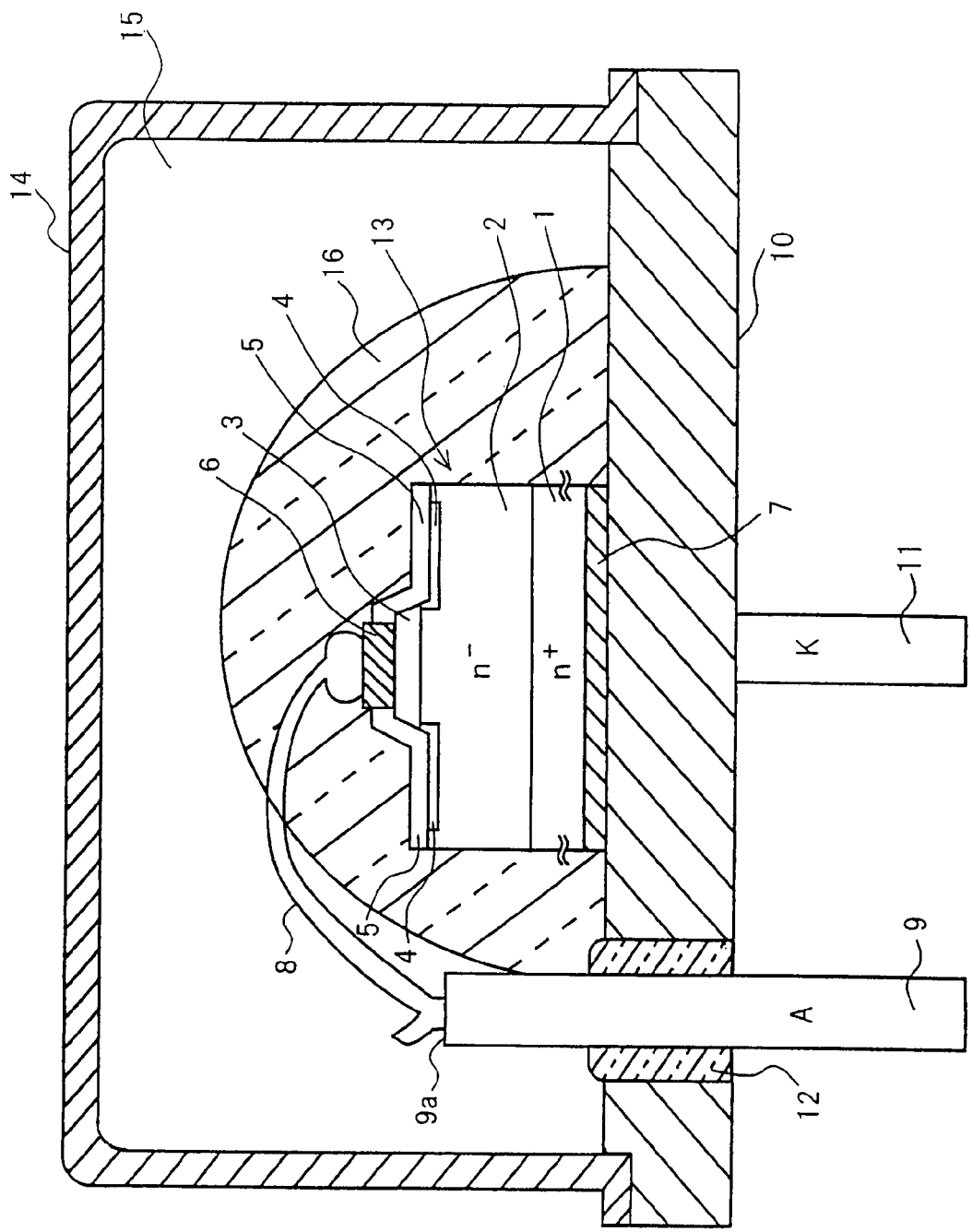
FIG. 1 is a cross-sectional view of a SiC-pn diode device according to a first embodiment of the present invention.

DESCRIPTION OF THE REFERENCE NUMERALS 1 cathode region
2 drift region
3 anode region
4 field-effect termination region
5 passivation film
6 anode electrode
7 cathode electrode
8 lead wire
9 anode terminal
10 support
11 cathode terminal
12 insulating glass
14 metal cap
15 inert gas such as nitrogen
16, 42, 81 coverture
21 cathode region
22 p-type base region
23 p-type drift layer
24 n-type base region
25 anode region
27 passivation film
29 anode electrode
31 gate electrode
32 cathode electrode
51 GaN-npn bipolar transistor
52 SiC photodiode
53 collector region
54 base region
55 emitter region
57 passivation film
60 light-emitting aperture
80 light-receiving portion

BEST MODE FOR CARRYING OUT THE INVENTION

Preferred embodiments of the present invention will be described below. In high-heat-resistive and high-withstand voltage semiconductor devices according to the embodiments of the invention, a semiconductor element included in the semiconductor device and at least a part of electrical connecting portions which electrically connect the semiconductor element to an external device are covered with a synthetic high molecular compound prepared by curing a silicon-containing curable composition.

According to the invention, the silicon-containing curable composition contains at least one silicon-containing polymer of components (A), (B), and (C) which will be described below in detail. When not containing component (C), the silicon-containing curable composition contains components (A) and (B). And further, the silicon-containing curable composition contains component (D) as another component.

[Description of Component (A)]

To begin with, component (A) will be described below. Component (A) of the present invention is a silicon-containing polymer which has one or more reactive groups (A') selected from the group consisting of the formulas Si—$R^1$, Si—O—$R^2$, and Si—$R^3$—OCOC($R^4$)=$CH_2$ (where $R^1$ and $R^2$ are each an $C_2$ to $C_{20}$ alkenyl group which may contain an alkylene group and/or an arylene group, $R^3$ is an $C_1$ to $C_9$ alkylene group and/or an $C_1$ to $C_9$ arylene group, and $R^4$ is a hydrogen atom or a methyl group) and which has bridged structures formed by Si—O—Si bonds at one location or more. Moreover, the silicon-containing polymer contains components having weight-average molecular weights of not more than 1000 at a content of not more than 20 wt %.

$R^1$ of the formula Si—$R^1$ as reactive group (A') is an alkenyl group. The alkenyl group can be directly bonded to the silicon atom or can be bonded to the silicon atom via the alkylene group, the arylene group, or the alkylene group and the arylene group. The carbon number of the alkenyl group (which may contain the alkylene group and/or the arylene group) is 2 to 20 and in terms of heat resistance, the carbon number is preferably 2 to 5. $R^1$ is preferably a vinyl group or an allyl group in terms of heat resistance and curability.

$R^2$ of the formula Si—O—$R^2$ as reactive group (A') is an alkenyl group. The alkenyl group may be directly bonded to the oxygen atom or may be bonded to the oxygen atom via the alkylene group, the arylene group, or the alkylene group and the arylene group. The carbon number of the alkenyl group (which may contain the alkylene group and/or the arylene group) is 2 to 20 and in terms of heat resistance, the carbon number is preferably 2 to 5. $R^2$ is preferably a vinyl group or an allyl group in terms of heat resistance and curability.

$R^3$ of the formula Si—$R^3$—OCOC($R^4$)=$CH_2$ as reactive group (A') is an alkylene group and/or an arylene group each having 1 to 9 carbon atoms and preferably having 1 to 5 carbon atoms. $R^4$ is a hydrogen atom or a methyl group and is preferably a hydrogen atom.

Component (A) has only to have bridged structures formed by Si—O—Si bonds at one location or more, and it is needless to say that plural Si—O—Si bonds can be continuously formed. And further, a structure in the shape of, for example, a ladder, a cage, a circle, or the like can be provided through the formation of such bridged structures. All or part of the structure in the shape of the ladder, the cage, the circle, or the like can be formed by Si—O—Si bonds.

Component (A) can be prepared by forming the siloxane bond represented as the formula Si—O—Si through the hydrolysis-condensation reaction of an alkoxysilane and a chlorosilane each having reactive groups (A'). With the introduction of reactive groups (A'), an alkoxysilane and/or a chlorosilane each having reactive groups (A') can be used, an alkoxysilane and/or a chlorosilane each having no reactive group (A') are hydrolyzed and condensed into a polymer and then reactive groups (A') can be introduced by using reactive functional groups such as Si—OH groups or Si—Cl groups, or both the above methods can be used in combination.

Examples of the alkoxysilane or the chlorosilane each having reactive group (A') include diallyl dimethoxysilane, allyl trimethoxysilane, allyl triethoxysilane, diallyl diethoxysilane, butenyl triethoxysilane, vinyl methyl diethoxysilane, vinyl methyl dimethoxysilane, vinyl triethoxysilane, vinyl trimethoxysilane, and chlorosilanes prepared by substituting chloro groups for part or all of the alkoxy groups of these alkoxysilanes. In addition, the alkoxy groups of the alkoxysilanes or the chloro groups of the chlorosilanes may be hydrolyzed into silanol groups. And furthermore, deuterides prepared by substituting deuterium for part or all of hydrogen atoms contained in these alkoxysilanes and chlorosilanes or fluorine compounds prepared by substituting fluorine atoms for part or all of their hydrogen atoms can be used, and those compounds can be used alone or in combination. In particular, vinyl trimethoxysilane, vinyl methyl dimethoxysilane, and chlorosilanes prepared by substituting chloro groups for alkoxyl groups contained in such silanes can be preferably used in terms of heat resistance, electric characteristics, curability, mechanical characteristics, storage stability, handling quality, and so on.

As the alkoxysilane or the chlorosilane each having no reactive group (A'), acetoxy methyltrimethoxysilane, benzyltriethoxysilane, bis(triethoxysilyl)methane, bis(triethoxysilyl)ethane, bis(triethoxysilyl)hexane, 3-bromopropyl trimethoxysilane, butyl trimethoxysilane, chloromethyl triethoxysilane, chlorophenyl triethoxysilane, 3-chloropropyl trimethoxysilane, diethyldiethoxysilane, diethyldimethoxysilane, dimethyldiethoxysilane, dimethyldimethoxysilane, dodecyltrimethoxysilane, ethyltriethoxysilane, ethyltrimethoxysilane, butyltrimethoxysilane, methoxypropyltrimethoxysilane, methyltriethoxysilane, methyltrimethoxysilane, octyltrimethoxysilane, phenylmethyldiethoxysilane, phenylmethyldimethoxysilane, phenyltriethoxysilane, phenyltrimethoxysilane, tetraethoxysilane, tetramethoxysilane, tolyltrimethoxysilane, diphenyldimethoxysilane, diphenyldiethoxysilane, trimethylmethoxysilane, trimethylethoxysilane, triethylethoxysilane, triphenylethoxysilane, diphenyldimethoxysilane, methylphenyldimethoxysilane, and so on can be preferably used. Moreover, organosilane having alkoxysilyl in both ends, such as 1,4-bis(dimethylmethoxysilyl)benzene, can also be used. And further, chlorosilanes prepared by substituting chloro groups for part or all of the alkoxy groups of these alkoxysilanes can be used and the alkoxy groups of the alkoxysilanes or the chloro groups of the chlorosilanes may be hydrolyzed into silanol groups. Still further, deuterides prepared by substituting deuterium atoms for part or all of the hydrogen atoms of the alkoxysilanes and the chlorosilanes, or fluorine compounds prepared by substituting fluorine atoms for part or all of their hydrogen atoms, can also be used alone or in combination. In particular, phenyltrimethoxysilane, methyltriethoxysilane, dimethyldiethoxysilane, diphenyldimethoxysilane, methylphenyldimethoxysilane, and silane compounds prepared by substituting chloro groups for their alkoxy groups, can be preferably used in terms of heat resistance, electric characteristics, curability, mechanical characteristics, storage stability, handling quality, and so on.

In order to obtain the silicon-containing polymer as component (A), the alkoxysilanes and/or the chlorosilanes can be used in combination; and besides if desired, an element other than silicon such as boron, magnesium, aluminum, phosphorus, titanium, iron, zinc, zirconium, niobium, tin, tellurium, or tantalum etc. can also be contained in the silicon-containing polymer by treating the polymer with another metal alcoholate, metallic chloride, metal complex, or the like, or hydrolyzing and condensing the polymer in combination with such an alcoholate, chloride, complex, or the like. In addition, when the silicon-containing polymer as component (A) has silanol groups, the number of the silanol groups can be adjusted by reaction with an alkylchlorosilane. As such the alkylchlorosilane, chlorine-monosubstituted (monochloro) silanes including trimethylchlorosilane can be used.

As the hydrolysis-condensation reaction of the alkoxysilanes and chlorosilanes, so-called sol-gel reaction can be run, which includes a method of hydrolyzing and condensing the silanes through the use of a catalyst such as an acid catalyst or a base catalyst without the use of a solvent or in a solvent. The solvent used at that time is not particularly specified; concrete examples of the solvent include water, methanol, ethanol, n-propanol, isopropanol, n-butanol, isobutanol, acetone, methyl ethyl ketone dioxane, and tetrahydrofuran, and these can be used alone or in combination.

The hydrolysis-condensation reaction of the alkoxysilanes and the chlorosilanes proceeds in stages where the alkoxysilanes and the chlorosilanes are hydrolyzed with water to yield silanol groups (Si—OH groups) and then the yielded silanol groups, the silanol groups and the alkoxyl groups, or the silanol groups and the chlorosilane groups condense each other. In order to speed up the hydrolysis, it is preferable to add the appropriate amount of water thereto and on top of it, the catalyst can be dissolved in the water. In addition, the hydrolysis also proceeds through the presence of moisture in the air or a very small of water contained in the solvent other than the water.

The catalyst such as an acid catalyst or a base catalyst for use in the hydrolysis-condensation reaction is not particularly specified provided that the hydrolysis-condensation reaction is speeded up by using the catalyst; concrete examples of the catalyst include inorganic acids such as hydrochloric acid, phosphoric acid, and sulfuric acid; organic acids such as acetic acid, p-toluenesulfonic acid, and monoisopropyl phosphate; inorganic bases such as sodium hydroxide, potassium hydroxide, lithium hydroxide, and ammonia; amine compounds (organic bases) such as trimethylamine, triethylamine, monoethanolamine, and diethanolamine; titanium compounds such as tetraisopropyltitanate, and tetrabutyltitanate; tin compounds such as dibutyl tinlaurate, and octyl stannate; boron compounds such as trifluoroborane; aluminum compounds such as aluminum trisacetylacetate; chlorides of metals such as iron, cobalt, manganese, and zinc; and metallic carboxylates such as naphthenates of these metals and octylates of these metals, and they can be used alone or in combination.

The order of the hydrolysis-condensation reaction is not particularly specified; when the two types or more of alkoxysilanes or chlorosilanes are hydrolyzed and condensed, the silanes can be separately hydrolyzed to some extent and then the silanes can be mixed for further hydrolysis-condensation reaction, while first all the silanes can be mixed together, and then hydrolyzed and condensed at one time.

Reactive groups (A') of the silicon-containing polymer as component (A) can be introduced from the chlorosilane and/or the alkoxysilane during the sol-gel reaction and can be introduced again after the sol-gel reaction. For example, reactive groups (A') can be introduced by means of covalent bonds between the Si—OH groups and/or the Si—Cl groups each left after the sol-gel reaction and the chlorosilane and/or the silanol each having reactive groups (A').

The silicon-containing polymer as component (A) can be prepared by means of the sol-gel reaction through the use of the alkoxysilane and/or the chlorosilane each having reactive groups (A') or having no reactive group (A'), while the silicon-containing polymer can be prepared by reacting silicon-containing polymer precursors prepared by the same reaction together. In the reaction between the precursors, part of reactive groups (A') can be used, such sol-gel reaction can be carried out, or the Si—OH groups and/or the Si—Cl groups can be used. It is needless to say that after the reaction between the precursors, reactive groups (A') can be introduced to give the silicon-containing polymer as component (A). According to the invention, by preparing one of the precursors as a linear polysiloxanes compound, a curable composition having excellent heat resistance and handling quality can be preferably obtained. In order to prepare the linear polysiloxane as the precursor, a bifunctional alkoxysilane and/or a bifunctional chlorosilane can be hydrolyzed and condensed. Examples of the bifunctional alkoxysilane and the bifunctional chlorosilane include diethyldiethoxysilane, diethyldimethoxysilane, dimethyldiethoxysilane, dimethyldimethoxysilane, phenylmethyldiethoxysilane, phenylmethyldimethoxysilane, diphenyldimethoxysilane, and diphenyldiethoxysilane. And further, it is also possible to use organosilanes having alkoxysilyl in both ends, such as 1,4-bis(dimethylmethoxysilyl)benzene. Still further, such examples include chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. Moreover, deuterides given by substituting deuterium atoms for all or part of the hydrogen atoms of these alkoxysilanes and chlorosilanes, or fluorine compounds given by substituting fluorine atoms for all or part of their hydrogen atoms can also be used. These can be used alone or in combination. It is needless to say that the bifunctional alkoxysilanes and/or the bifunctional chlorosilanes may contain reactive groups (A') In particular, dichlorodimethylsilane and dichlorodiphenylsilane can be preferably used.

In terms of curability and storage stability, the concentration of reactive groups (A') included in the silicon-containing polymer as component (A) is preferably 0.0001 to 100 mmol/g and more preferably 0.001 to 10 mmol/g.

And further, in terms of curability and storage stability, the number of reactive groups (A') included in the silicon-containing polymer as component (A) preferably averages at least one per one silicon-containing polymer molecule and is at most one per one silicon atom.

In the silicon-containing polymer as component (A), the content of the components having weight-average molecular weights of not more than 1,000 is not more than 20 wt %, preferably not more than 10 wt %, more preferably 0 wt % in terms of heat resistance.

The weight-average molecular weight of component (A) is preferably 5,000 to 1,000,000 in terms of heat resistance and handling quality such as fluidity.

The weight-average molecular weight of component (A) can be measured by means of GPC and determined in terms of the amount of polystyrene.

In the silicon-containing curable composition according to the invention, the content of component (A) can be suitably determined in consideration of the number of reactive groups (A'), the number of the Si—H groups of component (B), and so on; in terms of curability, the content is preferably 1 to 99 wt % and more preferably 35 to 50 wt %, for example.

[Description of Component (B)]

Next, component (B) will be described below. Component (B) is a silicon-containing polymer which has Si—H groups and has bridged structures formed by a Si—O—Si bond at one location or more. Moreover, the silicon-containing polymer contains components having weight-average molecular weights of not more than 1000 in an amount of not more than 20 wt %.

Component (B) has only to have the bridged structures formed by the Si—O—Si bonds at one location or more, and it is needless to say that the plural Si—O—Si bonds can be continuously and repeatedly formed. And further, a structure in the shape of, for example, a ladder, a cage, a circle, or the like can be provided through the formation of such bridged structures. All or part of the structure in the shape of the ladder, the cage, the circle, or the like can be formed by the Si—O—Si bond.

Component (B) can be prepared by forming a Si—O—Si siloxane bond through the hydrolysis-condensation reaction of the alkoxysilane and/or the chlorosilane each having Si—H functional groups. In order to introduce Si—H functional groups, the alkoxysilane and/or the chlorosilane each having Si—H groups can be used, reactive functional groups such as Si—OH groups or Si—Cl groups can be used after the alkoxysilane and/or the chlorosilane each having no Si—H group have been hydrolyzed and condensed to give a polymer, or both the above methods can be used in combination.

Examples of the alkoxysilane or the chlorosilane each having Si—H functional groups include dimethoxysilane, trimethoxysilane, triethoxysilane, diethoxysilane, phenyldimethoxysilane, methyldimethoxysilane, dimethylmethoxysilane, methylmethoxysilane, diphenylmethoxysilane, phenyldiethoxysilane, methyldiethoxysilane, dimethylethoxysilane, methylethoxysilane, diphenylethoxysilane, and chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. Moreover, deuterides given by substituting deuterium for all or part of the hydrogen atoms of these alkoxysilanes and chlorosilanes, fluorides given by substituting fluorine atoms for all or part of their hydrogen atoms, or the like can be used alone or in combination. In particular, methylmethoxysilane, dimethylmethoxysilane, diphenylmethoxysilane, phenylmethylmethoxysilane, the silane compounds given by substituting chloro groups for the alkoxy groups of these silanes, and so on can be preferably used in terms of heat resistance, electrical characteristics, curability, mechanical characteristics, storage stability, handling quality, and so forth.

Examples of the alkoxysilane or the chlorosilane each having no Si—H functional group include acetoxymethyltrimethoxysilane, benzyltriethoxysilane, bis(triethoxysilyl)methane, bis(triethoxysilyl)ethane, bis(triethoxysilyl)hexane, 3-bromopropyltrimethoxysilane, butyltrimethoxysilane, chloromethyltriethoxysilane, chlorophenyltriethoxysilane, 3-chloropropyltrimethoxysilane, diethyldiethoxysilane, diethyldimethoxysilane, dimethyldiethoxysilane, dimethyldimethoxysilane, dodecyltrimethoxysilane, ethyltriethoxysilane, ethyltrimethoxysilane, butyltrimethoxysilane, methoxypropyltrimethoxysilane, methyltriethoxysilane, methyltrimethoxysilane, octyltrimethoxysilane, phenylmethyldiethoxysilane, phenylmethyldimethoxysilane, phenyltriethoxysilane, phenyltrimethoxysilane, tetraethoxysilane, tetramethoxysilane, tolyltrimethoxysilane, diphenyldimethoxysilane, diphenyldiethoxysilane, trimethylmethoxysilane, trimethylethoxysilane, triethylethoxysilane, triphenylethoxysilane, and chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. And further, deuterides given by substituting deuterium atoms for all or part of the hydrogen atoms of these alkoxysilanes and chlorosilanes, fluorides given by substituting fluorine atoms for all or part of their hydrogen atoms, or the like can be used alone or in combination. In particular, phenylmethoxysilane, methyltriethoxysilane, dimethyldiethoxysilane, diphenyldimethoxysilane, methylphenyldimethoxysilane, silane compounds given by substituting chloro groups for the alkoxy groups of these silanes, and so on can be preferably used in terms of heat resistance, electrical characteristics, curability, mechanical characteristics, storage stability, handling quality, and so forth.

In order to prepare the silicon-containing polymer as component (B), the alkoxysilanes and/or the chlorosilanes can be used in combination; and besides if desired, an element other than silicon such as boron, magnesium, aluminum, phosphorus, titanium, iron, zinc, zirconium, niobium, tin, tellurium, or tantalum can also be contained in the silicon-containing polymer by treating the polymer with another metal alcoholate, metallic chloride, metal complex, or the like or hydrolyzing and condensing the polymer in combination with such as alcoholate, chloride, complex, or the like. In addition, when the silicon-containing polymer as component (B) has silanol groups, the number of the silanol groups can be adjusted by reaction with an alkylchlorosilane. As such an alkylchlorosilane, chlorine-monosubstituted (monochloro) silanes including trimethylchlorosilane can be used.

As the hydrolysis-condensation reaction of these alkoxysilanes and chlorosilanes, the sol-gel reaction used of the preparation of component (A) can be carried out, and such a reaction proceeds in the same reaction mechanism as that described earlier. In order to speed up the reaction, it is preferable to add the appropriate amount of water thereto as described earlier. In addition, the above various catalysts for use in speeding up hydrolysis-condensation reaction can be used. For example, a method can be preferably used in which after the acid catalyst for use in speeding up hydrolysis-condensation reaction has been added thereto to proceed the reaction under acidic conditions (a pH below 7), the base catalyst for use in speeding up hydrolysis-condensation reaction is added thereto to run the reaction under neutral or basic conditions. The order of the hydrolysis-condensation reaction is also not specified as described above.

The Si—H functional groups of the silicon-containing polymer as component (B) can be introduced from the chlorosilane and/or the alkoxysilane each during the sol-gel reaction, or such groups can be introduced again after the sol-gel reaction. For example, the Si—H functional groups can be introduced by means of covalent bonds formed by reacting Si—OH groups and/or Si—Cl groups each left after the sol-gel reaction with the chlorosilane and/or the silanol each having Si—H functional groups.

The silicon-containing polymer as component (B) can be prepared by means of the above sol-gel reaction through the use of the alkoxysilane and/or the chlorosilane each having Si—H functional groups or having no Si—H functional group, while the silicon-containing polymer can be prepared by reacting silicon-containing polymer precursors given by the same sol-gel reaction together. In the reaction between the precursors, part of the Si—H functional groups can be used, a sol-gel reaction can be carried out, or the Si—OH groups and/or the Si—Cl groups can be used. It is needless to say that after the reaction between the precursors, Si—H functional groups can be introduced to give the silicon-containing polymer as component (B). According to the invention, by preparing one of the precursors as a linear polysiloxane compound, a curable composition having excellent heat resistance and handling quality can be preferably obtained. In order to prepare the linear polysiloxane as the precursor, the bifunctional alkoxysilane and/or the bifunctional chlorosilane can be hydrolyzed and condensed. Examples of the bifunctional alkoxysilane and chlorosilane include diethyldiethoxysilane, diethyldimethoxysilane, dimethyldiethoxysilane, dimethyldimethoxysilane, phenylmethyldiethoxysilane, phenylmethyldimethoxysilane, diphenyldimethoxysilane, and diphenyldiethoxysilane. And further, it is also possible to use organosilanes having alkoxysilyl in both ends, such as 1,4-bis(dimethylmethoxysilyl) benzene. Still further, chlorosilanes given by substituting chloro groups for part or all of the alkoxy groups of these alkoxysilanes can be used. In addition, the alkoxy groups of the alkoxysilanes or the chloro groups of the chlorosilanes can be hydrolyzed into silanol groups. Moreover, deuterides given by substituting deuterium for all or part of the hydrogen atoms of these alkoxysilanes and chlorosilanes, fluorides given by substituting fluorine atoms for all or part of their hydrogen atoms, or the like can also be used alone or in combination. It is needless to say that the bifunctional alkoxysilanes and/or the bifunctional chlorosilanes may contain Si—H functional groups. In particular, dichlorodimethylsilane, dichlorodiphenylsilane, and the like can be preferably used.

In the silicon-containing polymer as component (B), the concentration of the Si—H functional groups is preferably 0.0001 to 100 mmol/g and more preferably 0.001 to 10 mmol/g in terms of curability and storage stability.

The number of the Si—H functional groups included in the silicon-containing polymer as component (B) preferably averages at least one per one silicon-containing polymer molecule and is at most one per one silicon atom.

In the silicon-containing polymer as component (B), components having weight-average molecular weights of not more than 1,000 is not more than 20 wt %, preferably not more than 10 wt %, and are more preferably not included, in terms of heat resistance.

The weight-average molecular weight of component (B) is preferably 5,000 to 1,000,000 in terms of heat resistance and handling quality.

The weight-average molecular weight of component (B) can be measured by means of GPC and determined in terms of the amount of polystyrene.

In the silicon-containing curable composition according to the invention, the content of component (B) can be suitably determined in consideration of the number of the Si—H groups, the number of reactive groups (A') of component (A), and so on; in terms of curability, the content is preferably 1 to 99 wt % and more preferably 35 to 50 wt %, for example.

[Description of Component (C)]

Next, component (C) will be described below. Component (C) is a silicon-containing polymer which has one or more reactive groups (A') selected from the group consisting of the formulas Si—$R^1$, Si—O—$R^2$, and Si—$R^3$—OCOC($R^4$)=CH$_2$ (where $R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group), has Si—H groups, and has a bridged structure formed by a Si—O—Si bond at one location or more. Moreover, the silicon-containing polymer contains components having weight-average molecular weights of not more than 1,000 in an amount of not more than 20 wt %.

$R^1$ of the formula Si—$R^1$ as reactive group (A') is an alkenyl group. The alkenyl group can be directly bonded to the silicon atom or can be bonded to the silicon atom via the alkylene group, the arylene group, or the alkylene group and the arylene group. The alkenyl group (which may contain the alkylene group and/or the arylene group) has 2 to 20 carbon atoms and in terms of heat resistance, the carbon number is preferably 2 to 5. $R^1$ is preferably a vinyl group or an allyl group in terms of heat resistance and curability.

$R^2$ of the formula Si—O—$R^2$ as reactive group (A') is an alkenyl group. The alkenyl group can be directly bonded to the oxygen atom or can be bonded to the oxygen atom via the alkylene group, the arylene group, or the alkylene group and the arylene group. The alkenyl group (which may contain the alkylene group and/or the arylene group) has 2 to 20 carbon atoms and in terms of heat resistance, the carbon number is preferably 2 to 5. $R^2$ is preferably a vinyl group or an allyl group in terms of heat resistance and curability.

$R^3$ of the formula Si—$R^3$—OCOC($R^4$)=CH$_2$ as reactive group (A') is a $C_1$ to $C_9$ alkylene group and/or a $C_1$ to $C_9$ arylene group and their carbon number is preferably 1 to 5. $R^4$ is a hydrogen atom or a methyl group and is preferably a hydrogen atom.

Component (C) has only to have bridged structures formed by Si—O—Si bonds at one location or more, and it is needless to say that plural Si—O—Si bonds can be continuously and repeatedly formed. And further, a structure in the shape of, for example, a ladder, a cage, a circle, or the like can be provided through the formation of such a bridged structure. All or part of the structure in the shape of the ladder, the cage, the circle, or the like can be formed by Si—O—Si bonds.

Component (C) can be prepared by forming the siloxane bond represented as the formula Si—O—Si through the hydrolysis-condensation reaction of the alkoxysilane and/or the chlorosilane each having reactive groups (A') and the alkoxysilane and/or the chlorosilane each having Si—H groups. It is needless to say that the alkoxysilane and/or the chlorosilane each having both reactive groups (A') and Si—H groups can be used and this method can be combined with the above method. Moreover, with the introduction of reactive groups (A') and the Si—H groups, the alkoxysilane and/or the chlorosilane each having the reactive groups (A') and/or the Si—H groups can be used, the alkoxysilane and/or the chlorosilane each not having the reactive groups (A') and/or the Si—H groups are hydrolyzed and condensed into a polymer and then any ones of reactive groups (A') and Si—H groups or both can be introduced by using reactive functional groups such as Si—OH groups or Si—Cl groups, or both the above methods can be used in combination.

Examples of the alkoxysilane or the chlorosilane each having reactive groups (A') include diallyldimethoxysilane, allyltrimethoxysilane, allyltriethoxysilane, diallyldiethoxysilane, butenyltriethoxysilane, vinylmethyldiethoxysilane, vinylmethyldimethoxysilane, vinyltriethoxysilane, vinyltrimethoxysilane, and chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. And further, deuterides given by substituting deuterium for all or part of the hydrogen atoms of these alkoxysilanes and chlorosilanes, fluorides given by substituting fluorine atoms for all or part of their hydrogen atoms, or the like can also be used alone or in combination. In particular, trimethoxyvinylsilane, dimethylmethoxyvinylsilane, chlorosilanes given by substituting chloro groups for the alkoxyl groups of these silanes, and so on can be preferably used in terms of heat resistance, electrical characteristics, curability, mechanical characteristics, storage stability, handling quality, and so forth.

Examples of the alkoxysilane or the chlorosilane each having Si—H functional groups include dimethoxysilane, trimethoxysilane, triethoxysilane, diethoxysilane, phenyldimethoxysilane, methyldimethoxysilane, dimethylmethoxysilane, methylmethoxysilane, diphenylmethoxysilane, phenyldiethoxysilane, methyldiethoxysilane, dimethylethoxysilane, methylethoxysilane, diphenylethoxysilane, and chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. And further, deuterides given by substituting deuterium for all or part of the hydrogen atoms of these alkoxysilanes and chlorosilanes, fluorides given by substituting fluorine atoms for all or part of their hydrogen atoms, or the like can be used alone or in combination. In particular, methylmethoxysilane, dimethylmethoxysilane, diphenylmethoxysilane, phenylmethylmethoxysilane, silane compounds given by substituting chloro groups for the alkoxy groups of these silanes, and so on can be preferably used in terms of heat resistance, electrical characteristics, curability, mechanical characteristics, storage stability, handling quality, and so forth.

Examples of the alkoxysilane or the chlorosilane each having both the reactive groups (A') and the Si—H groups include dimethoxyvinylsilane, diethoxyvinylsilane, methylmethoxyvinylsilane, phenylmethoxyvinylsilane, methylethoxyvinylsilane, phenylethoxyvinylsilane, dimethoxyallylsilane, diethoxyallylsilane, methymethoxyallylsilane, phenylmethoxyallylsilane, methylethoxyallylsilane, phenylethoxyallylsilane, and chlorosilanes given by substituting chloro groups for part or all of the alkoxy groups of these alkoxysilanes. In addition, the alkoxy groups of the alkoxysilanes or the chloro groups of the chlorosilanes can be hydrolyzed into silanol groups. Moreover, deuterides given by substituting deuterium for all or part of the hydrogen atoms of these alkoxysilanes and chlorosilanes, fluorides given by substituting fluorine atoms for all or part of their by hydrogen atoms, or the like can also be used alone or in combination. In particular, methylmethoxyvinylsilane, phenylmethoxyvinylsilane, dimethoxyvinylsilane, the silane compounds given by substituting the chloro groups for the alkoxy groups of these silanes, and so on can be preferably used in terms of heat resistance, electrical characteristics, curability, mechanical characteristics, storage stability, handling quality, and so forth.

As the alkoxysilane or the chlorosilane each having no reactive group (A') and no Si—H group, acetoxymethyltrimethoxysilane, benzyltriethoxysilane, bis(triethoxysilyl)methane, bis(triethoxysilyl)ethane, bis(triethoxysilyl)hexane, 3-bromopropyltrimethoxysilane, butyltrimethoxysilane, chloromethyltriethoxysilane, chlorophenyltriethoxysilane, 3-chloropropyltrimethoxysilane, diethyldiethoxysilane, diethyldimethoxysilane, dimethyldiethoxysilane, dimethyldimethoxysilane, dodecyltrimethoxysilane, ethyltriethoxysilane, ethyltrimethoxysilane, butyltrimethoxysilane, methoxypropyltrimethoxysilane, methyltriethoxysilane, methyltrimethoxysilane, octyltrimethoxysilane, phenylmethyldiethoxysilane, phenylmethyldimethoxysilane, phenyltriethoxysilane, phenyltrimethoxysilane, tetraethoxysilane, tetramethoxysilane, tolyltrimethoxysilane, diphenyldimethoxysilane, diphenyldiethoxysilane, trimethylmethoxysilane, trimethylethoxysilane, triethylethoxysilane, triphenylethoxysilane, diphenyldimethoxysilane, methylphenyldimethoxysilane, and so on can be preferably used. And further, it is also possible to use organosilanes having alkoxysilyl in both ends, such as 1,4-bis(dimethylmethoxysilyl)benzene. Still further, chlorosilanes given by substituting chloro groups for part or all of the alkoxy groups of these alkoxysilanes and so on can be used and on top of it, the alkoxy groups of the alkoxysilanes or the chloro groups of the chlorosilanes can be hydrolyzed into silanol groups. Furthermore, deuterides given by substituting deuterium for all or part of the hydrogen atoms of these alkoxysilanes and chlorosilanes, fluorides given by substituting fluorine atoms for all or part of their hydrogen atoms, or the like can also be used alone or in combination. In particular, phenyltrimethoxysilane, methyltriethoxysilane, dimethyldiethoxysilane, diphenyldimethoxysilane, methylphenyldimethoxysilane, the silane compounds given by substituting chloro groups for the alkoxy groups of these silanes, and so on can be preferably used in terms of heat resistance, electrical characteristics, curability, mechanical characteristics, storage stability, handling quality, and so forth.

In the preparation of the silicon-containing polymer as component (C), the alkoxysilanes and/or the chlorosilanes can be used in combination when component (C) includes both reactive groups (A') and Si—H functional groups, and besides if desired, an element other than silicon such as boron, magnesium, aluminum, phosphorus, titanium, iron, zinc, zirconium, niobium, tin, tellurium, or tantalum can also be contained in the silicon-containing polymer by treating the polymer with another metal alcoholate, metallic chloride, metal complex, or the like or hydrolyzing and condensing the polymer in combination with the use of such an alcoholate, chloride, complex, or the like. In addition, when the silicon-containing polymer as component (C) has silanol groups, the number of the silanol groups can be adjusted by reaction with an alkylchlorosilane. As such an alkylchlorosilane, chlorine-monosubstituted (monochloro) silanes including trimethylchlorosilane can be used.

As the hydrolysis-condensation reaction of these alkoxysilanes or chlorosilanes, the sol-gel reaction used for the preparation of components (A) and (B) can be carried out, and such a reaction proceeds in the same reaction mechanism as that described earlier. In order to speed up the reaction, it is preferable to add the appropriate amount of water thereto as described earlier. In addition, the above various catalysts for use in speeding up hydrolysis-condensation reaction can be used. For example, a method can be preferably used in which after the acid catalyst for use in speeding up hydrolysis-condensation reaction has been added thereto to proceed the reaction under acidic conditions (a pH below 7), the base catalyst for use in speeding up hydrolysis-condensation reaction is added thereto to run the reaction under neutral or basic conditions. The order of the hydrolysis-condensation reaction is also not specified as described above.

In the silicon-containing polymer as component (C), the reactive groups (A') and/or the Si—H functional groups can be introduced from the chlorosilanes and/or the alkoxysilanes each during the sol-gel reaction and can be introduced again after the sol-gel reaction. For example, the reactive groups (A') and/or the Si—H functional groups can be introduced by means of covalent bonds formed by reacting Si—OH groups and/or Si—Cl groups each left after the sol-gel reaction with the chlorosilane and/or the silanol each having reactive groups (A') and/or Si—H functional groups.

The silicon-containing polymer as component (C) can be prepared by mean of the foregoing sol-gel reaction through the use of the alkoxysilane and/or the chlorosilane each having reactive groups (A') and/or Si—H functional groups and the alkoxysilane and/or the chlorosilane each having no reactive group (A') and Si—H functional group, while the silicon-containing polymer can be prepared by reacting silicon-containing polymer precursors given by means of the same sol-gel reaction together. In the reaction between the precursors, part of reactive groups (A') and/or part of Si—H functional groups can be used, such a sol-gel reaction can be used, or Si—OH groups and/or Si—Cl groups can be used. It is needless to say that after the reaction between the precursors, reactive groups (A') and/or Si—H functional groups can be introduced to give the silicon-containing polymer as component (C). According to the invention, by preparing one of the precursors as a linear polysiloxane compound, a curable composition having excellent heat resistance and handling quality can be preferably obtained. In order to prepare the linear polysiloxane as the precursor, the bifunctional alkoxysilane and/or the bifunctional chlorosilane can be hydrolyzed and condensed. Examples of such bifunctional alkoxysilane and bifunctional chlorosilane include diethyldiethoxysilane, diethyldimethoxysilane, dimethyldiethoxysilane, dimethyldimethoxysilane, phenylmethyldiethoxysilane, phenylmethyldimethoxysilane, diphenyldimethoxysilane, and diphenyldiethoxysilane. And further, it is also possible to use organosilanes having alkoxysilyl in both ends, such as 1,4-bis(dimethylmethoxysilyl)benzene. Still further, chlorosilanes given by substituting chloro groups for part or all of the alkoxy groups of these alkoxysilanes and so on can be used. In addition, the alkoxy groups of the alkoxysilanes or the chloro groups of the chlorosilanes can be hydrolyzed into silanol groups. Furthermore, deuterides given by substituting deuterium for all or part of the hydrogen atoms of these alkoxysilanes and chlorosilanes, fluorides given by substituting fluorine atoms for all or part of their hydrogen atoms, or the like can also be used alone or in combination. It is needless to say that the bifunctional alkoxysilanes and/or the bifunctional chlorosilanes may include reactive groups (A') and/or Si—H functional groups. In particular, dichlorodimethylsilane, dichlorodiphenylsilane, and so on can be preferably used.

In the silicon-containing polymer as component (C), the concentration of reactive group (A') is preferably 0.0001 to 100 mmol/g and more preferably 0.001 to 10 mmol/g in terms of curability and storage stability. In addition, the concentration of the Si—H functional groups of the silicon-containing polymer as component (C) is preferably 0.0001 to 100 mmol/g more preferably 0.001 to 10 mmol/g in terms of curability and storage stability.

In terms of curability and storage stability, it is preferable that the number of reactive groups (A') of the silicon-containing polymer as component (C) average at least one per one silicon-containing polymer molecule and is at most one per one silicon atom. Likewise, it is preferable that the number of the Si—H functional groups of the silicon-containing polymer as component (C) average one or more per one silicon-containing polymer molecule and is one or less per one silicon atom.

In the silicon-containing polymer as component (C), the content of the components having weight-average molecular weights of not more than 1,000 is not more than 20 wt %, preferably not more than 10 wt %, more preferably 0 wt % in terms of heat resistance.

The weight-average molecular weight of component (C) is preferably 5,000 to 1,000,000 in terms of heat resistance and handling quality. The weight-average molecular weight of component (C) can be measured by means of GPC and determined in terms of the amount of polystyrene.

In the silicon-containing curable composition according to the invention, the content of component (C) can be suitably determined in consideration of the number(s) of the reactive groups (A') and/or the Si—H functional groups of component (C). And further, when the silicon-containing curable composition contains component (A) and/or component (B), the content of component (C) can be suitably determined in consideration of the numbers of their the reactive groups (A') and/or the Si—H functional groups etc. When neither component (A) nor component (B) is contained therein, the content of component (C) is preferably, for example, 1 to 99 wt % in terms of curability.

Next, the preferred total content of the aryl groups and arylene groups of a silicon-containing polymer composed of components (A), (B), or (C) will be described below. In the invention, the inventors have found out that the total content of the aryl groups and arylene groups of the silicon-containing polymer contained in the silicon-containing curable composition has a considerable effect on heat resistance and handling quality. That is, it has been found out that although heat resistance is heightened by including the aryl groups or the arylene groups, too much the content impairs fluidity and therefore has an ill effect on handling quality.

To be more specific, in the silicon-containing polymer composed of components (A), (B), and (C) contained in the silicon-containing curable composition according to the invention, the total content of the aryl groups and the arylene groups is preferably 0.1 to 50 wt %, more preferably 1 to 25 wt %, even more preferably 5 to 15 wt % in terms of heat resistance and handling quality. If the total content exceeds 50 wt %, fluidity is impaired, and thus handing quality is degraded.

In a case where component (C) is not contained therein, the ratio of the total content of the aryl groups and arylene groups of component (A) to the total content of those groups of component (B) is preferably 0.5 to 1.5:0.5 to 1.5 in weight ratio, more preferably 0.8 to 1.2:0.8 to 1.2.

As an example of the aryl groups and the arylene groups, phenyl groups or phenylene groups are preferred.

[Description of Component (D)]

Next, a curing catalyst, which is a platinum catalyst as component (D) according to the present invention, will be described below.

The platinum catalyst as component (D) refers to known catalysts containing one or more metals of platinum, palladium, and rhodium which accelerate hydrosilylation reaction. Examples of these platinum catalysts used as the catalyst for hydrosilylation reaction include platinum catalysts such as a platinum-carbonylvinylmethyl complex, a platinum-divinyltetramethyldisiloxane complex, a platinum-cyclovinylmethylsiloxane complex and a platinum-octylaldehyde complex and compounds containing palladium, rhodium, or the like which is also a platinum-group metal instead of platinum, and they can be used alone or in combination. In particular, those containing platinum are preferred in terms of curability; specifically, platinum-carbonylvinylmethyl complexes are preferred. And further, so-called Wilkinson catalysts containing the platinum-group metal such as chlorotris-triphenylphosphine rhodium (I) can also be used as the platinum catalyst used herein.

In the silicon-containing curable composition according to the invention, the content of component (D) is preferable not more than 5 wt %, more preferably 0.0001 to 1.0 wt % in terms of curability and storage stability. When the content of component (D) is above 5 wt %, the stability of the silicon-containing curable composition tends to become poor.

[Description of Component (E)]

It is preferable that the above silicon-containing curable composition further contain fine metal oxide powder as component (E). The fine metal oxide powder as component (E) refers to inorganic materials, such as so-called fillers and minerals, and substances prepared by organically modifying those materials; examples of the fine metal oxide powder include minerals such as colloidal silica, silica filler, silica gel, mica, and montmorillonite and metal oxides such as aluminum oxide and zinc oxide. And further, materials modified by subjecting those substances to organic modification process or the like can also be used. Mica contains metallic elements such as Al, Ba, Ca, Fe, K, Li, Mg, Na, and Si. By adding these fine metal oxide powders thereto, preferred physical properties can be obtained. As particularly preferred fine powder, fine silicon dioxide powder can be used. The diameter of the fine particles of these metal oxides is preferably not more than 100 μm, more preferably not more than 50 μm in terms of heat resistance.

The content of component (E) of the silicon-containing curable composition is preferably not more than 90 wt %, more preferably not more than 50 wt % in terms of heat resistance and handling quality.

The silicon-containing curable composition may further contain a free-radical scavenger as an optional component. As such a free-radical scavenger, any oxidation-resistant substances can be use provided that they are antioxidants, stabilizers, and so on; examples of those substances include triethyleneglycol-bis[3-(3-t-butyl-5-methyl-4-hydroxyphenyl) propionate], dibutyl hydroxytoluene (BHT), 2,6-di-t-butyl-paracresol (DBPC) and so on.

The content of the free-radical scavenger contained in the silicon-containing curable composition is preferably 0.1 to 50 wt %, more preferably 1 to 30 wt % in terms of heat resistance, electrical characteristics, curability, mechanical characteristics, storage stability, and handling quality.

The silicon-containing curable composition according to the invention can be cured by the application of heat provided that at least one of the silicon-containing polymers as components (A), (B), and (C) (when component (C) is not contained, both components (A) and (B)) and the platinum catalyst as component (D) are mixed together. As a method for curing the composition, a method can be used in which these components are mixed and heated together immediately before using them. In addition, another method can also be used in which after those materials have been mixed together in advance, the mixture is cured by the application of heat when necessary. Any one of them can be used.

A temperature to which the curable composition is heated for curing is in the range of 0° to 300° C., preferably in the range of 100° to 200° C. A curing time is in the range of 0.1 to 10 hours, preferably in the range of 1 to 6 hours. By carrying out curing reaction under these conditions, a cured product (synthetic high molecular compound) having excellent heat resistance, crack resistance, etc. can be prepared from the silicon-containing curable composition according to the invention.

The silicon-containing curable composition according to the invention has good fluidity at room temperature (25° C.) and therefore has excellent handling quality. Moreover, the cured product (synthetic high molecular compound) obtained by curing the silicon-containing curable composition is excellent in heat resistance and crack resistance. Specifically, the cured product having a feature that a temperature at which its weight is reduced by 5 wt % due to the heating is at least 300° C., preferably at least 370° C. can be suitably obtained. And further, the cured product in which few cracks appear can be suitably obtained. As to its fluidity, the viscosity of the curable composition measured at room temperature (25° C.) by using an E-type viscometer is preferably not more than 50 Pa·S and more preferably, the curable composition with a viscosity of not more than 10 Pa·S can be obtained.

In the silicon-containing curable composition according to the invention, the curing reaction caused by reactions between its reactive groups (A') and between its Si—H groups rapidly proceeds by virtue of the effect of the curing catalyst, the platinum catalyst as component (D). Because of this, the resulting cured product (synthetic high molecular compound) has excellent physical properties and is particularly excellent in heat resistance, solvent resistance, and alkali resistance. Moreover, since the silicon-containing curable composition is uniform in composition and is transparent, light such as ultraviolet rays can pass therethrough well, and therefore the composition can also be photo-cured by adding a photoreactive catalyst thereto. It is needless to say that photoreactive monomer and photoreactive resin can be further contained therein or any one or more of components (A), (B), and (C) may have photoreactive groups. And furthermore, a material can be prepared which is excellent in mechanical characteristics, optical qualities, electrical characteristics, etc. such as weatherability, hardness, contamination resistance, flame retardancy, moisture resistance, gas barrier properties, flexibility, elongation strength, electrical insulation properties, and low permittivity.

Furthermore, various known resins, fillers, additives, and so on other than components (A), (B), (C), (D), and (E) described above can also be contained in the silicon-containing curable composition according to the invention as optional components in the range in which the performance of the semiconductor device according to the invention to be achieved is not impaired. Moreover, further functions can be provided thereto by attaching various organofunctional groups to any one or more of components (A), (B), and (C). In addition, a high-functionality composite material can also be prepared by using the silicon-containing curable composition or the cured product made thereof as a matrix and dispersing other useful compounds into the matrix.

Examples of the various resins which can be optionally contained therein include polyimide resin, polyether resin such as polyethylene glycol and polypropylene glycol, polyurethane resin, epoxy resin, phenolic resin, polyester resin, melamine resin, polyamide resin, and polyphenylene sulfide resin.

Examples of the additives which can be optionally contained therein include an ultraviolet absorber, an antistatic agent, and an antioxidant.

The synthetic high molecular compound according to the invention can be prepared by heat-curing the silicon-containing curable composition described above in detail.

In the following, the high-heat-resistive semiconductor device according to the present invention will be described by way of preferred embodiments with reference to FIGS. 1 to 4. In order to facilitate the understanding of the structure of components illustrated in the figures, the dimensions of the illustrated components do not correspond with their actual dimensions. The term "semiconductor device" described in the embodiments refers to a device fabricated by connecting the electrodes of a semiconductor element to corresponding electrode terminals via lead wires and by housing the element in a package.

First Embodiment

A high-heat-resistive semiconductor device according to a first embodiment of the present invention will be described below with reference to FIG. 1.

The semiconductor device according to the first embodiment of the invention is a SiC-pn diode device provided with a high-heat-resistive and high-withstand voltage SiC(silicon carbide)-pn diode element (hereinafter abbreviated as "SiC diode element").

FIG. 1 is a cross-sectional view of the SiC-pn diode device with a withstand voltage of 7 kV according to the first embodiment of the invention. As shown in FIG. 1, a SiC diode element 13 included in the SiC-pn diode device has a structure described below. A n-type SiC drift layer 2 having a thickness of about 80 μm and a low impurity concentration is formed on the top surface of a n-type SiC cathode region 1 having a thickness of about 300 μm and a high impurity concentration. On the under surface of the cathode region 1, a cathode electrode 7 is formed. On the central region of the drift layer 2, a p-type SiC anode region 3 for use in forming a main junction is formed. On the anode region 3, an anode electrode 6 is formed. Around the anode region 3, a p-type field-relief region 4 is formed. On the top surface of the SiC diode element 13 including the anode region 3 and the field-relief region 4, a surface protection film 5 is formed. The surface protection film 5 has a three-layer structure in which a silicon dioxide layer, a silicon nitride layer, and a silicon dioxide layer are stacked together in that order. The anode electrode 6 is connected to the top end 9a of an anode terminal 9 by using a gold lead wire 8 as an electrical connecting portion. Although the lead wire 8 is illustrated as a single wire in FIG. 1, the lead wire 8 can be plurally used according to the value of electric current flowing therethrough in such a way that the lead wires 8 are provided in parallel with each other.

The cathode electrode 7 is attached to a metal support 10 with an electric connection. The support 10 forms part of the package of this device. A cathode terminal 11 is connected to the support 10. The anode terminal 9 and the cathode terminal 11 are connected to wiring for an external device and so on. The anode terminal 9 is fixed to the support 10 so as to be insulated from the support 10 by a high-melting insulating glass 12. The lead wire 8, the anode terminal 9, and the cathode terminal 11 are "electrical connecting portions". A metal cap 14 is provided on the top surface of the support 10 so as to cover the SiC diode element 13, by which a space 15 within the package including the SiC diode element 13 is sealed. A coverture 16 of a synthetic high molecular compound is provided so as to cover the SiC diode element 13 within the space 15 and part of the lead wire 8. The space 15 is filled with, for example, a nitrogen gas.

An example of a method for manufacturing the SiC-pn diode device according to the embodiment will be described below. As shown in FIG. 1, the SiC diode element 13 fabricated in advance is attached to a predetermined place in the top surface of the support 10 by using hot solder including gold silicon. Both ends of the individual 80-μm-diameter gold lead wires 8 are respectively connected to the metal anode electrode 6 and the top end 9a of the anode terminal 9 by using a lead bonding apparatus.

Then the application of the foregoing silicon-containing curable composition is carried out so as to cover the entire surface of the SiC diode element 13, the junction of the lead wires 8 and the metal anode electrode 6, and the vicinity of the junction, following which the composition is cured into the coverture 16 of the synthetic high molecular compound.

This silicon-containing curable composition is synthetically prepared in synthesis processes 1 to 5 described below.

[Synthesis Process 1]

86 parts of a 0.4% phosphoric acid aqueous solution was added to 100 parts of methyltriethoxysilane and then the mixture was stirred at a temperature of 10° C. to 15° C. for 3 hours. To the reaction liquid, 80 parts of ethanol was added and the liquid was neutralized with aqueous sodium hydroxide, following which the liquid was stirred at 60° C. for 30 minutes. After the reaction, the ethanol and water were distilled away from the solvent while adding 900 parts of toluene thereto to give a silicon-containing polymer precursor-1. The analysis of the silicon-containing polymer precursor-1 by GPC showed that its molecular weight Mw is 5,000. The molecular weight was determined under measurement conditions describe below in terms of the amount of polystyrene. The analyses of compositions prepared in synthesis process described below by GPC were also carried out under the same measurement conditions as that described above.

Conditions for measuring molecular weights are as follows:

Column: TSK-GEL MULTIPORE HXL M available from Tosoh Corp. (7.8 mm×300 mm) and

Developing Solvent: tetrahydrofuran.

[Synthesis Process 2]

90 parts of dichlorodimethylsilane and 9 parts of dichlorodiphenylsilane were mixed together and then the mixture was added dropwise to a mixed solvent composed of 100 parts of ion-exchange water and 100 parts of toluene. Then the aqueous phase was removed from the reaction liquid, following which the liquid mixture was polymerized at 250° C. for 2 hours while distilling the toluene solvent away therefrom. To the resulting reaction solution, 20 parts of pyridine was added, 20 parts of dimethyldichlorosilane was further added thereto, and the solution was stirred for 30 minutes. Thereafter, the reaction solution was heated at 250° C. under reduced pressure to remove the low molecular weight components and pyridine hydrochloride, giving a silicon-containing polymer precursor-2. The analysis of the silicon-containing polymer precursor-2 by GPC showed that its molecular weight Mw is 50,000.

[Synthesis Process 3]

5 parts of the silicon-containing polymer precursor-1 prepared in synthesis process 1, 10 parts of pyridine, and 1.5 parts of trimethylchlorosilane were added to toluene as a solvent and then the mixture was stirred for 30 at room temperature. To the mixture, 100 parts of the silicon-containing polymer precursor-2 prepared in synthesis process 2 was added and the mixture was copolymerized for 4 hours with stirring, following which the reaction was stopped by adding ion-exchange water thereto. Thereafter, pyridine hydrochloride was removed therefrom by washing with water to give a silicon-containing polymer precursor-3. The analysis of the silicon-containing polymer precursor-3 by GPC showed that its molecular weight Mw is 92,000.

[Synthesis Process 4]

50 parts of the silicon-containing polymer precursor-3 prepared in synthesis process 3 and 5 parts of pyridine was added to toluene as a solvent and then the resulting mixture was divided into halves. After 5 parts of dimethylchlorosilane was added to one of the mixtures and 5 parts of dimethylvinylchlorosilane was added to the other mixture, both the mixtures were each stirred for 30 minutes at room temperature and further stirred for 30 minutes at 70° C. Thereafter, pyridine hydrochloride was removed from the individual mixtures by washing with ion-exchange water, by which a silicon-containing polymer-3B as component (B) was prepared from the former mixture and a silicon-containing polymer-3A as component (A) was prepared from the latter. Both the silicon-containing polymers-3A and -3B had a molecular weight Mw of 92,000. The analysis of the polymers-3A and -3B by $H^1$-NMR and GPC showed that their aryl group content is 8.4 wt % and components having weight-average molecular weights of not more than 1,000 are not included.

[Synthesis Process 5]

30 parts of fine silicon dioxide powder as component (E) and 0.005 parts of a platinum-carbonylvinylmethyl complex as component (D) acting as a catalyst for curing reaction were mixed into 70 parts of a mixture of the silicon-containing polymers-3A and -3B in equal proportions to give a silicon-containing curable composition-A.

Next, the step of applying the silicon-containing curable polymer-A prepared in synthesis processes 1 to 5 will be described below. As suitable methods for applying the composition, a drop method and a method of extruding the predetermined amount of silicon-containing curable composition-A from a nozzle with a pore having a predetermined diameter are available. The viscosity of the silicon-containing curable composition-A is 16 Pa·S at 25° C., and therefore it has good fluidity at room temperature (25° C.). When applied, the composition-A accumulates to the shape of a mountain close to the shape of the coverture 16 of FIG. 1 and has very excellent handling quality. By holding the silicon-containing curable composition-A at about 200° C. for a predetermined time period after its application, the composition-A can be easily cured with its flexibility secured to a certain extent and therefore has excellent curability as well. After the curing, the synthetic high molecular compound keeps the shape of a mountain represented as the shape of the coverture 16 of FIG. 1 and can cover closely the entire SiC diode element 13 with a thickness of at least 400 µm. When the viscosity of the silicon-containing curable composition-A is too high as compared with the above value, some gaps may occur between the SiC diode element 13 and the coverture 16 at the time of its application. In contrast, when the viscosity is too low, the composition A does not accumulate to the shape of a mountain, and therefore it is impossible to form the coverture 16 so as to have a desired thickness of 400 µm or more.

Finally, the metal cap 14 is attached to the support 10, both are welded together in a nitrogen atmosphere, and then the internal space 15 is filled with a nitrogen gas, thereby the making of the SiC-pn diode is completed.

When a voltage (reverse voltage) was applied between the anode terminal 9 and the cathode terminal 11 of the SiC-pn diode according to the embodiment in such a way that a potential at the cathode terminal 11 became higher, a reverse withstand voltage measured was about 7.5 kV. It was possible to maintain such a value of the reverse withstand voltage even at a high temperature at which Si semiconductor devices are unable to operate, for example, 250° C. When the reverse voltage was 7 kV, its leakage current density was below $8 \times 10^{-5}$ A/cm$^2$. When the SiC-pn diode according to the embodiment was subjected to a 750-hour continuous-current test by passing an electric current therethrough at a current density of 200 A/cm$^2$ in a high-temperature atmosphere of 250° C., crack and deformation did not occur in the coverture 16 of the synthetic high molecular compound after the test. In addition, there was no deterioration in its transparency caused by cloudiness and so on. A forward voltage was 4.2 V during passing the electric current the energization and hardly changed before and after the 750-hour continuous-current test. When the leakage current was measured by applying the reverse voltage of 7 kV in a high-temperature atmosphere of 250° C. after the 750-hour continuous-current test, the density of the leakage current was $6 \times 10^{-5}$ A/cm$^2$ and therefore hardly changed as compared with that measured before the continuous-current test. After the individual tests described above, the semiconductor device was broken up to visually observe its individual portions. As a result, it was confirmed that the synthetic high molecular compound firmly adheres to not only the surface protection film 5 on the field-relief region 4 of the SiC diode element 13 but also the SiC layers exposed at the sides of the SiC diode element 13. Incidentally, a reverse recovery time serving as the operating speed of the SiC-up diode was about 45 nanoseconds and there was no variation in the reverse recovery time before and after the continuous-current test.

According to the first embodiment of the invention, insulating properties, i.e., high withstand voltage properties, whose level is the same as or higher than that brought by placing the SiC diode element 13 in an atmosphere of a sulfur hexafluoride gas, can be achieved by covering the periphery of the SiC diode element 13 with the coverture 16 of the synthetic high molecular compound. That is, the SiC-pn diode having high heat resistance and excellent insulating properties can be implemented without the use of a sulfur hexafluoride gas which is a harmful substance causing global warming.

Second Embodiment

Figure 2:
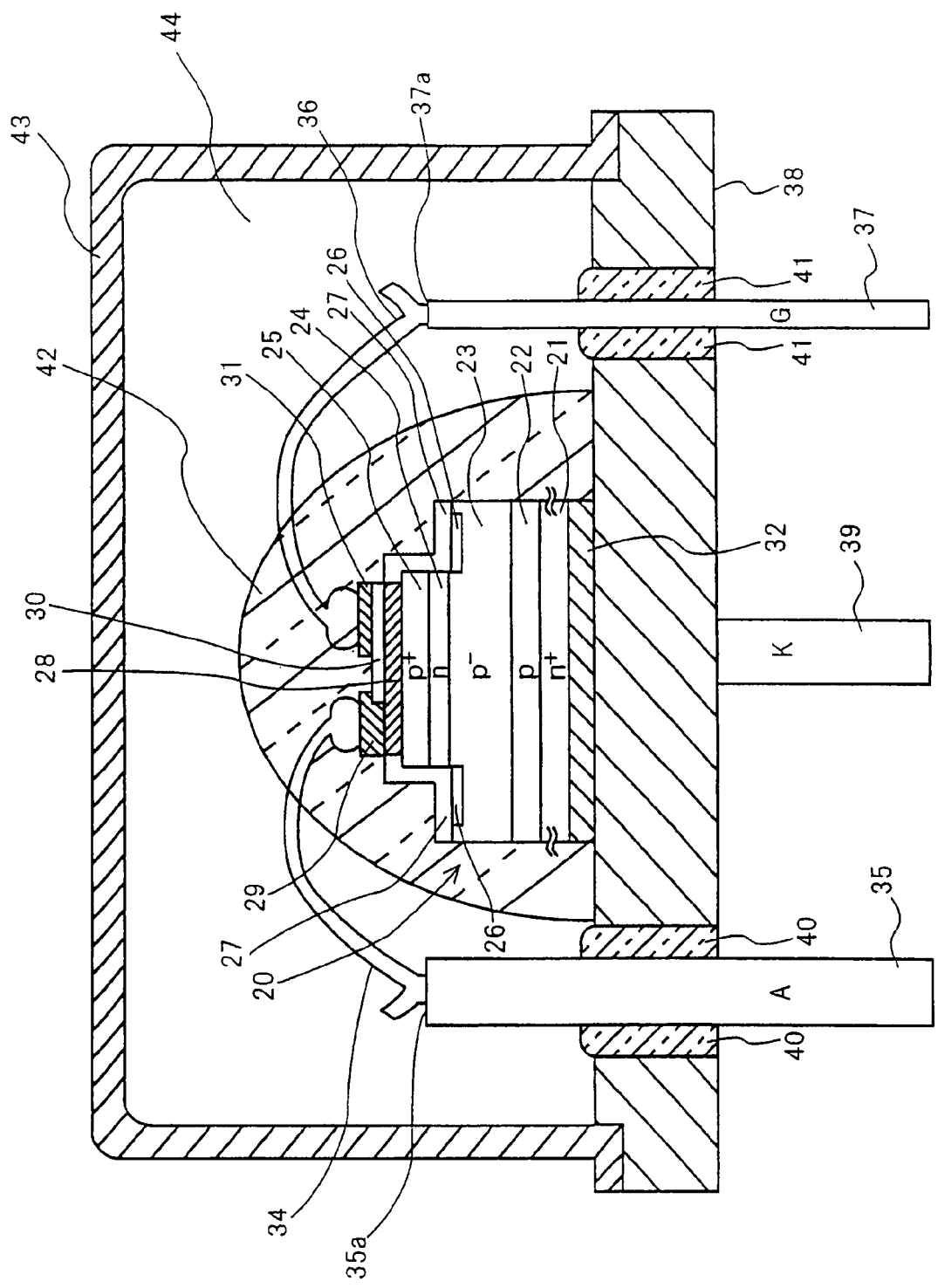
FIG. 2 is a cross-sectional view of a SiC-GTO thyristor device according to a second embodiment of the invention.
Figure 3:
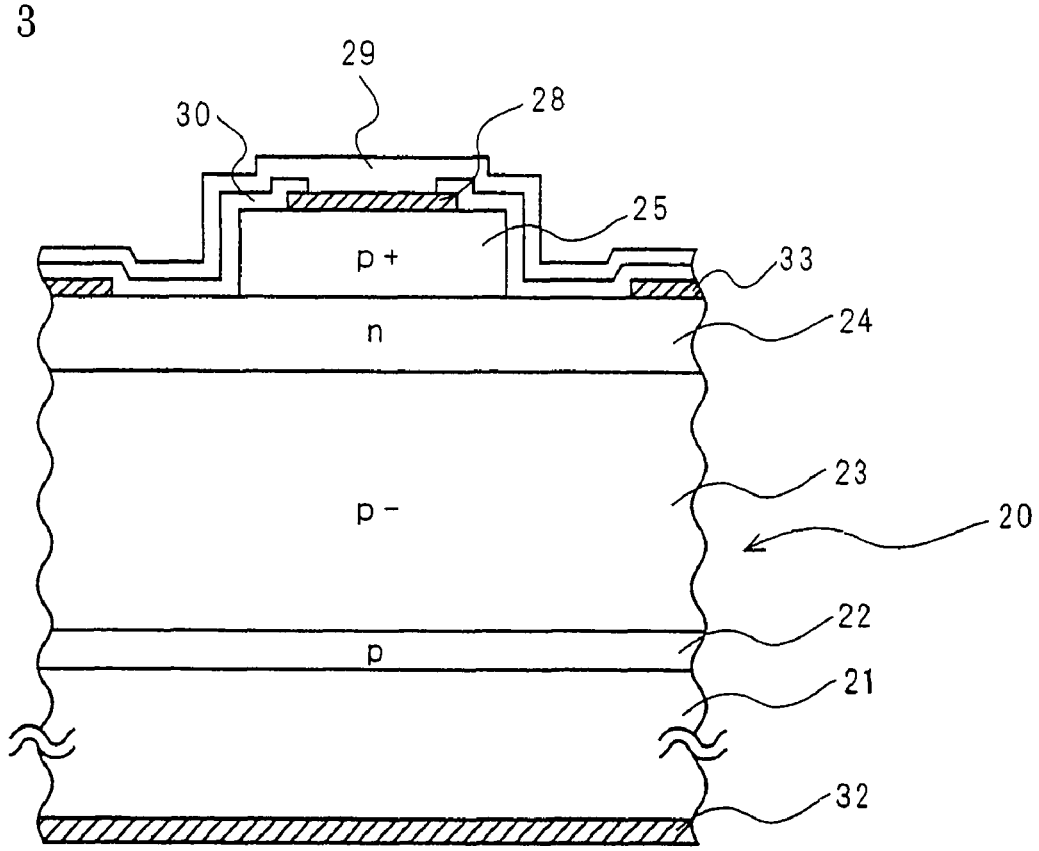
FIG. 3 is a cross-sectional view of a SiC-GTO thyristor element according to the second embodiment of the invention taken along a direction perpendicular to a sheet surface on which the element of FIG. 2 is illustrated.

A semiconductor device according to a second embodiment of the invention is a SiC-GTO(gate turn off) thyristor device having a GTO thyristor element 20 made of SiC and a withstand voltage of 4 kV. FIG. 2 is a cross-sectional view of the semiconductor device, and FIG. 3 is a cross-sectional view of a cell of a GTO thyristor element 20 shown in FIG. 2 taken along a direction perpendicular to a sheet surface on which the element 20 is illustrated. In the actual element 20, the cell of FIG. 3 is plurally formed in such a way that the cells are connected one after the other in the left-right direction of FIG. 3. In FIGS. 2 and 3, a p-type SiC buffer layer 22 having a thickness of about 3 µm is provided on the top surface of a n-type SiC cathode region 21 having a thickness of about 320 µm and a high impurity concentration. On the under surface of the cathode region 21, a cathode electrode 32 is provided. A p-type SiC drift layer 23, which has a thickness of about 50 µm and a low impurity concentration, is provided on the buffer layer 22. A n-type base region 24 and a p-type anode region 25 each having a thickness of about 2 µm are formed on the central portion of the drift layer 23 in that order. Around the n-type base region 24, a n-type field-relief region 26 is formed. A surface protection film 27, which has a three-layer structure consisting of a silicon dioxide layer, a silicon nitride layer, and a silicon dioxide layer in that order, is formed on the surface of the GTO thyristor element 20. On the p-type anode region 25, an anode electrode 28 is formed. A second anode electrode 29 is formed in the left region of the top surface of the anode electrode 28, and a gate electrode 31 is formed in the right region via an insulating film 30. As shown in FIG. 3, a first gate electrode 33 is formed on the n-type base region 24 and then connected to a gate electrode 31 via a connecting portion (not shown).

The anode electrode 29 is connected to the top end 35a of an anode terminal 35 via a gold lead wire 34. The gate electrode 31 is connected to the top end 37a of a gate terminal 37 via a gold lead wire 36. The lead wires 34 and 36, the anode terminal 35, and the gate terminal 37 are electrical connecting portions. The cathode electrode 32 is attached to a metal support 38. The metal support 38 has a cathode terminal 39 and constitutes part of the package of the device. The anode terminal 35 and the gate terminal 37 are fixed to the support 38 in such a way that both the terminals 35 and 37 penetrate the support 38 with both electrically insulated from the support 38 by high-melting insulating glasses 40 and 41 respectively.

The application of a silicon-containing curable composition-B is carried out so as to cover the entire surface of the GTO thyristor element 20, the junctions of the lead wires 34 and 36 and the GTO thyristor element 20, and the vicinities of the junction, thereby a coverture 42 made of a synthetic high molecular compound is formed.

The silicon-containing curable composition-B used as the synthetic high molecular compound for the coverture 42 was synthesized in synthesis processes 1 to 5 described below. By heat-curing the silicon-containing curable composition-B, the coverture 42 made of the synthetic high molecular compound can be obtained.

[Synthesis Process 1]

A silicon-containing polymer precursor-1 was synthesized in the same synthesis process as synthesis process 1 included in the above synthetic method for the silicon-containing curable composition-A according to the first embodiment. That is, 86 parts of a 0.4% phosphoric acid aqueous solution was added to 100 parts of methyltriethoxysilane and then the mixture was stirred at a temperature of 10° C. to 15° C. for 3 hours. To the reaction liquid, 80 parts of ethanol was added and the liquid was neutralized with aqueous sodium hydroxide, following which the liquid was stirred at 60° C. for 30 minutes. After the reaction, the ethanol and water in the solvent were distilled away while adding 900 parts of toluene thereto to give a silicon-containing polymer precursor-1. The analysis of the silicon-containing polymer precursor-1 by GPC showed that its molecular weight Mw is 5,000. The molecular weight was determined under measurement conditions described below in terms of the amount of polystyrene. The analyses of compositions prepared in synthesis processes described below by GPC were also carried out under the same measurement conditions as those described above.

Conditions for measuring their molecular weights are as follows:

Column: TSK-GEL MULTIPORE HXL M available from Tosoh Corp. (7.8 mm×300 mm) and

Developing Solvent: tetrahydrofuran.

[Synthesis Process 2]

80 parts of dichlorodimethylsilane and 20 parts of dichlorodiphenylsilane were mixed together and then the mixture was added dropwise to a mixed solvent composed of 100 parts of ion-exchange water and 100 parts of toluene. Then the aqueous phase was removed from the reaction liquid, following which the liquid mixture was polymerized at 250° C. for 2 hours while distilling the toluene solvent away therefrom. To the resulting reaction solution, 20 parts of pyridine was added, 20 parts of dimethyldichlorosilane was further added thereto, and then the solution was stirred for 30 minutes. Thereafter, the reaction solution was heated at 250° C. under reduced pressure to remove the low molecular weight components and pyridine hydrochloride, giving a silicon-containing polymer precursor-4. The analysis of the silicon-containing polymer precursor-4 by GPC showed that its molecular weight Mw is 30,000.

[Synthesis Process 3]

5 parts of the silicon-containing polymer precursor-1 prepared in synthesis process 1, 10 parts of pyridine, and 1.5 parts of trimethylchlorosilane were added to a toluene solvent and then the mixture was stirred at room temperature for 30 minutes. To the mixture, 100 parts of the silicon-containing polymer precursor-4 prepared in synthesis process 2 was added and the resulting mixture was copolymerized for 4 hours with stirring, following which the reaction was stopped by adding ion-exchange water thereto. Thereafter, pyridine hydrochloride was removed therefrom by washing with water to give a silicon-containing polymer precursor-5. The analysis of the silicon-containing polymer precursor-5 by GPC showed that its molecular weight Mw is 90,000.

[Synthesis Process 4]

50 parts of the silicon-containing polymer precursor-5 prepared in synthesis process 3 and 5 parts of pyridine were added to a toluene solvent and then the mixture was divided into halves. After 5 parts of dimethylchlorosilane was added to one of the mixtures and 5 parts of dimethylvinylchlorosilane was added to the other mixture, both the mixtures were stirred at room temperature for 30 minutes and further stirred at 70° C. for 30 minutes. Thereafter, pyridine hydrochloride was removed from the individual mixtures by washing with ion-exchange water, by which a silicon-containing polymer-5B as component (B) was prepared from the former mixture and a silicon-containing polymer-5A as component (A) was prepared from the latter mixture. Both the silicon-containing polymers-5A and -5B had a molecular weight Mw of 90,000. The analyses of the polymers-5A and -5B by $H^1$-NMR and GPC showed that their aryl group contents are 13.0 wt % and components having weight-average molecular weights of not more than 1,000 are not included.

[Synthesis Process 5]

30 parts of fine silicon dioxide powder as component (E) and 0.005 parts of a platinum-carbonylvinylmethyl complex as component (D) acting as a catalyst for curing reaction were mixed into 70 parts of a mixture of the silicon-containing polymers-5A and -5B in equal proportions to give a silicon-containing curable composition-B.

As suitable methods for applying the silicon-containing curable composition-B, a drop method and a method of extruding the predetermined amount of silicon-containing curable composition-B from a nozzle with a pore having a predetermined diameter are available as in the case of the first embodiment. The viscosity of the silicon-containing curable composition-B is 30 Pa·S at 25° C., and therefore the composition-B has good fluidity at room temperature (25° C.). When applied, the composition-B accumulates to the shape of a mountain close to the shape of the coverture 42 of FIG. 2 and has excellent handling quality. By holding the silicon-containing curable composition-B at about 200° C. for a predetermined time period after the application, the composition B is easily cured with its flexibility secured to a certain extent and thus has excellent curability as well. After the curing, the synthetic high molecular compound is able to keep the shape of a mountain as the coverture 42 of FIG. 2 and cover closely the entire GTO thyristor element 20 with at least 400 µm thick. When the viscosity of the synthetic high molecular compound is too high, some gaps may be produced between the GTO thyristor element 20 and the coverture 42 at the time of its application. In contrast, when the viscosity is too low, the compound does not accumulate to the shape of a mountain, and therefore it is impossible to form the coverture 42 so as to have a desired thickness of at least 400 µm.

Finally, the metal cap 43 is attached to the support 38 in a nitrogen atmosphere and then they were welded together to complete the making of the SIC-GTO thyristor device whose internal space 44 of the package is filled with the nitrogen gas.

Incidentally, the GTO thyristor element 20 is soldered to the support 38 by using hot solder of gold silicon. The lead wires 34 and 36 are 80-µm-diameter gold wires and are provided between the anode electrode 29 and the anode terminal 35 and between the gate electrode 31 and the gate terminal 37 respectively by using a lead bonding apparatus. In FIG. 2, the lead wires 34 and 36 are each illustrated as a single wire; however, the individual lead wires 34 and 36 can be plurally provided according to the values of electric currents flowing therethrough in such a way that the plural lead wires 34 are connected in parallel with each other and the plural lead wires 36 are connected in parallel with each other.

In the Sic-GTO thyristor device according to the second embodiment, when a forward voltage of 4 kV has been applied so that the potential of the anode terminal 35 becomes higher than that of the cathode terminal 39 and then the potential of the gate terminal 37 has been made equal to that of the anode terminal 35, an OFF state in which no current flows is maintained and a withstand voltage of 4 kV has been achieved.

Next, when the potential of the gate terminal 37 has been made lower than that of the anode terminal 35 in the OFF state to pass a gate current from the anode terminal 35 to the gate terminal 37, the SiC-GTO thyristor device is turned on and a current flows between the anode terminal 35 and the cathode terminal 39. Furthermore, when the potential of the gate terminal 37 has been made higher than that of the anode terminal 35 in the ON state, the current flowing between the anode terminal 35 and the cathode terminal 39 transfers between the gate terminal 37 and the cathode terminal 39, and therefore the device is turned off. The reverse withstand voltage refers to a voltage between the anode terminal 35 and the cathode terminal 39 brought about at that time.

Specifically, when a negative voltage has been applied to the cathode terminal 39 and a voltage above a built-in voltage has been applied to the gate terminal 37 based on a voltage at the anode terminal 35, the SiC-GTO thyristor device is turned on. Since electrons are injected from the cathode region 22 into the drift layer 23 at that time, conductivity modulation occurs and an on resistance significantly decreases. When the potential of the gate terminal 37 has been made higher than that of the anode terminal 35 in the state in which the SiC-GTO thyristor device has been turned on, part of a current flowing between the anode terminal 35 and the cathode terminal 39 is drawn from the gate terminal 37 and the GTO thyristor is turned off.

The SiC-GTO thyristor device according to the second embodiment had a reverse withstand voltage of about 4.6 kV, and it was possible to maintain the reverse withstand voltage even at a high-temperature atmosphere of 250° C. The density of a leakage current caused at a reverse voltage of 4 kV was as good as no more than $1 \times 10^{-4}$ A/cm$^2$. Then the SiC-GTO thyristor device according to the embodiment was subjected to first and second performance tests described below.

In the first performance test, the SiC-GTO thyristor device according to the embodiment was continuously operated for 300 hours in a high-temperature atmosphere of 250° C. while passing a current therethrough at a current density of 200 A/cm$^2$. Incidentally, conventional GTO thyristors made of silicon are unable to operate in a case where they have an element temperature of 250° C. In addition, in 4-kV-level GTO thyristors made of silicon, it is difficult to manufacture those with a current density of 200 A/cm$^2$.

In the second performance test, the SiC-GTO thyristor device according to the embodiment was continuously operated for 250 hours in an atmosphere of a high temperature of 80° C. and a high humidity of 85% while passing a current therethrough at the current density described above. When the SiC-GTO thyristor device was broken up and its individual potions were checked for damage after the first and second performance tests, deformation, crack, and cloudiness did not occur in the coverture 42 made of the synthetic high molecular compound.

The SiC-GTO thyristor device had a forward voltage of 4.4 V immediately after the start of the first performance test. When the forward voltage was measured on the same conditions as those made in the first performance test after the completion of the first and second performance tests, the value of the forward voltage measured was almost the same as that measured at the start of the first performance test; the difference between them was in the range of a measurement error. When a reverse voltage of 4 kV was applied thereto after the completion of the first and second performance tests, the leakage current density was below $2 \times 10^{-4}$ A/cm$^2$ at a temperature of 250° C., and therefore the density hardly changed. A turn-on time was 0.3 microseconds, and a turn-off time was 0.5 microseconds. In the switching times as well, there was no change before and after the first and second performance tests. Incidentally, the turn-on and turn-off times of the SIC-GTO thyristor device according to the embodiment is about one-thirtieth those of conventional GTO thyristors made of silicon having a withstand voltage of 6 kV.

As a result of checking the state in which the synthetic high molecular compound of the second embodiment adheres to the GTO thyristor element 20 and so on, it has been found out that the synthetic high molecular compound firmly adheres to not only the surface protection film 27 on the field-relief region 26 of the GTO thyristor element 20 but also the exposed SiC sides of the element 20.

Third Embodiment

Figure 4:
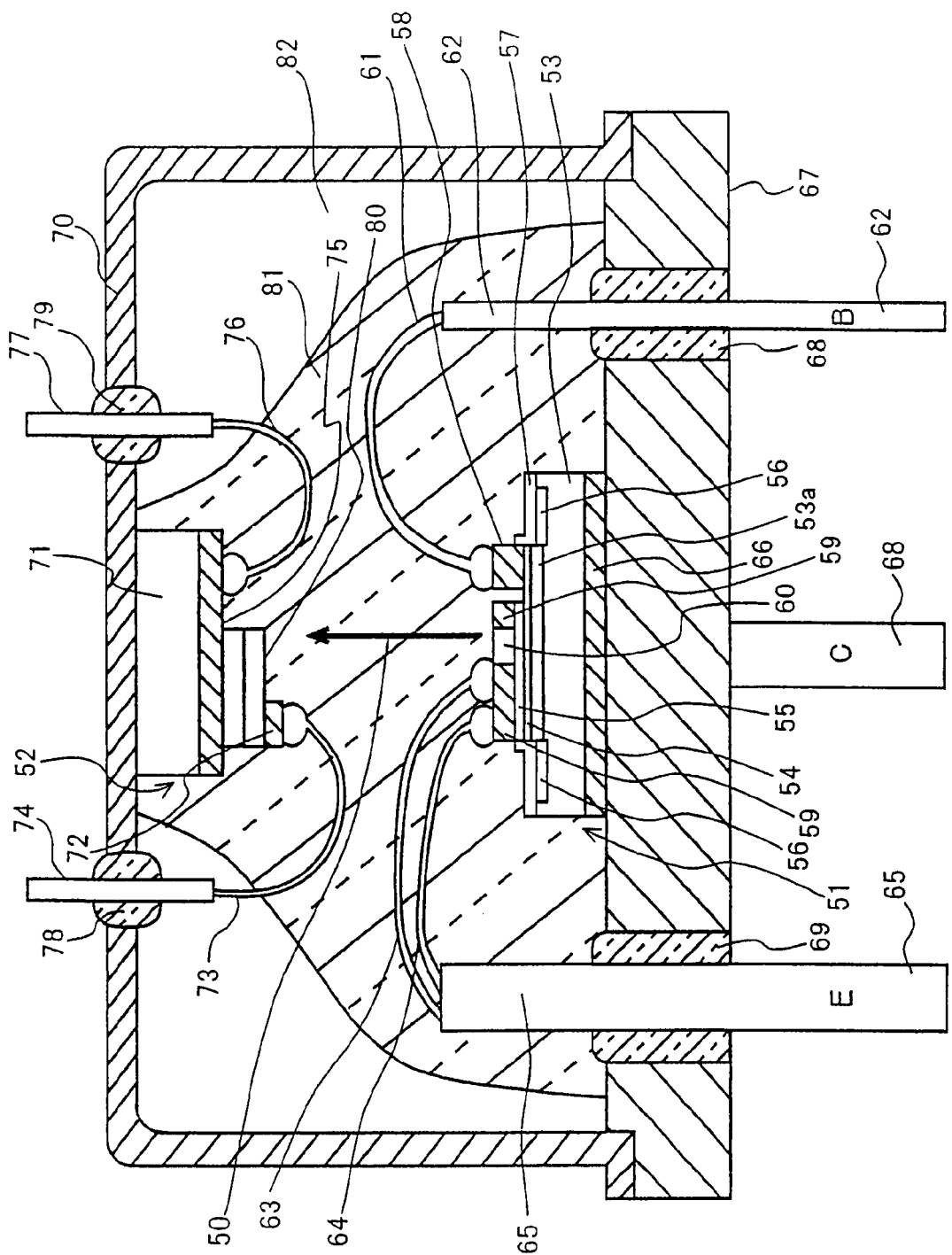
FIG. 4 is a cross-sectional view of a photocoupled wide gap power semiconductor device according to a third embodiment of the invention.
Figure 5:
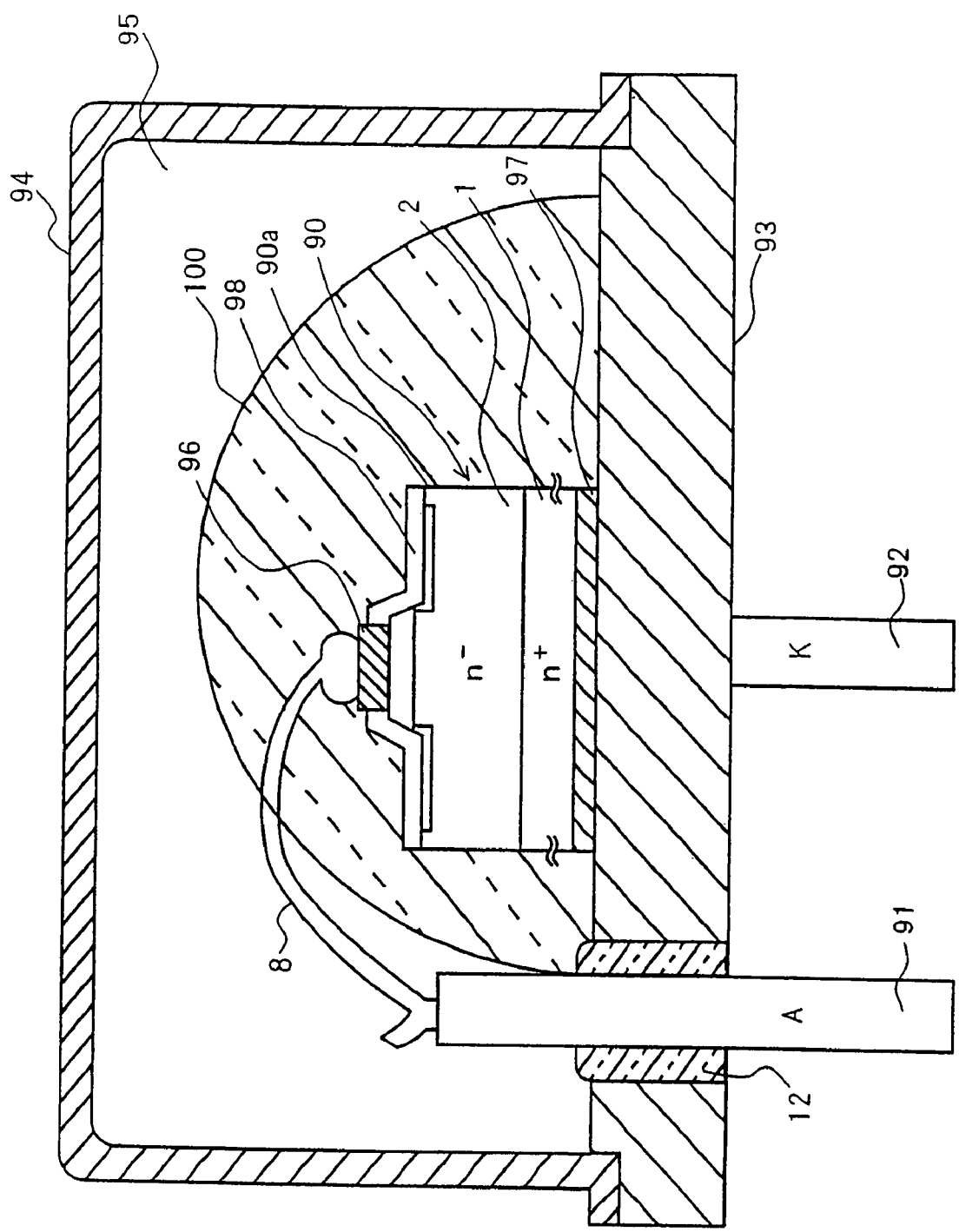
FIG. 5 is a cross-sectional view of a conventional SiC diode device.

A semiconductor device according to a third embodiment of the present invention is a photocoupled wide gap power semiconductor device provided with a light-emitting element and a light-receiving element. FIG. 4 is a cross-sectional view of the photocoupled wide gap power semiconductor device according to the third embodiment. In FIG. 4, a GaN(gallium nitride)-npn bipolar transistor 51 having a withstand voltage of 2.5 kV and a current capacity of 200 A is used as a main power semiconductor element (light-emitting element) having a light-emitting function. As the light-receiving element, a SiC photodiode 52 is used. The Sic photodiode 52 is provided in one package so as to be opposite to the GaN-npn bipolar transistor 51.

In the GaN-npn bipolar transistor 51 shown in FIG. 4, a n-type GaN region 53a having a thickness of about 20 μm and a low impurity concentration is formed on the top surface of a n-type GaN collector region 53 having a thickness of about 300 μm and a high impurity concentration. On the GaN region 53a, a p-type GaN base region 54 having a thickness of about 1.7 μm is formed and a n-type emitter region 55 having a thickness of about 3 μm and a high impurity concentration is further formed on the base region 54. On the under surface of the GaN collector region 53, a collector electrode 66 is provided. In the collector region 53 around the GaN base region 54, a n-type field-relief region 56 is formed. On the right end of the top surface of the GaN base region 54, a metal base electrode 58 is provided. On the n-type emitter region 55, a metal emitter electrode 59 with a light-emitting aperture 60 is provided. On the GaN collector region 53 and the field-relief region 56, a surface protection film 57 having a two-layer structure consisting of a silicon nitride layer and a silicon dioxide layer is formed.

The base electrode 58 is connected to a base terminal 62 via a gold lead wire 61. The emitter electrode 59 is connected to an emitter terminal 65 via gold lead wires 63 and 64. A collector electrode 66 is attached to a metal support 67 with an electric connection with the support 67 established. The metal support 67 has a collector terminal 68 and constitutes part of the package of the device.

The light-receiving portion 80 of the SiC photodiode 52 is bonded to the inside surface of a cap 70 via a insulating plate 71 such as aluminum nitride so as to be opposite to the light-emitting aperture 60 of the GaN-npn bipolar transistor 51. The anode electrode 72 of the SiC photodiode 52 is connected to a metal anode terminal 74 via a gold lead wire 73. A cathode electrode 75 is connected to a cathode terminal 77 via a gold lead wire 76. The anode terminal 74 and the cathode terminal 77 are each connected to corresponding external wiring. The anode terminal 74 and the cathode terminal 77 are fixed in the through holes of the cap 70 via high-melting insulating glasses 78 and 79 respectively in such a way that both terminals 74 and 77 penetrate the through holes.

The lead wires 61, 63, 64, 73, and 76, the emitter terminal 65, the base terminal 62, the collector terminal 68, the anode terminal 74, and the cathode terminal 77 are electrical connecting portions. The lead wires 61, 63, 64, 73, and 76 can be plurally used according to the values of currents flowing through them in such a way that the lead wires 61 are connected in parallel with each other and the other lead wires 63, 64, 73, and 76 are done as in the case of the lead wires 61.

A coverture 81 made of a synthetic high molecular compound is provided so as to cover the GaN-npn bipolar transistor 51, the SiC photodiode 52, the lead wires 61, 63, 64, 73, and 76, the end of the base terminal 62, and the end of the emitter terminal 65.

An example of a method for manufacturing the photo-coupled wide gap power semiconductor device according to the third embodiment will be described below. The GaN-npn bipolar transistor 51 fabricated in advance is soldered to the predetermined place of the support 67 by using high-melting solder of gold silicon. The 80-μm-diameter gold lead wires 63 and 64 are connected between the emitter electrode 59 and the emitter terminal 65 by using a lead bonding apparatus. The gold lead wire 61 is connected between the base electrode 58 and the base terminal 62. A material for the synthetic high molecular compound 81 to be cured is thickly applied so as to cover the GaN-npn bipolar transistor element 51.

A silicon-containing curable composition used as the synthetic high molecular compound for the coverture 81 was synthetically prepared in synthesis processes 1 to 5 described below. The synthetic high molecular compound 81 can be prepared by heat-curing the silicon-containing curable composition-C.

[Synthesis Process 1]

A silicon-containing polymer precursor-1 was synthesized in the same synthesis process as synthesis process 1 included in the foregoing synthetic method for the silicon-containing curable composition-A according to the first embodiment. That is, 86 parts of a 0.4% phosphoric acid aqueous solution was added to 100 parts of methyltriethoxysilane and then the mixture was stirred at a temperature of 10° to 15° C. for 3 hours. To the reaction liquid, 80 parts of ethanol was added and the liquid was neutralized with aqueous sodium hydroxide, following which the liquid was stirred at 60° C. for 30 minutes. After the reaction, the ethanol and water in the solvent was distilled away while adding 900 parts of toluene thereto to give a silicon-containing polymer precursor-1. The analysis of the silicon-containing polymer precursor-1 by GPC showed that its molecular weight Mw is 5,000. The molecular weight was determined under measurement conditions described below in terms of the amount of polystyrene. The analyses of compositions prepared in synthesis processes described below by GPC were also carried out under the measurement conditions described below.

Conditions for measuring their molecular weights are as follows:
Column: TSK-GEL MULTIPORE HXL M available from Tosoh Corp. (7.8 mm×300 mm) and
Developing Solvent: tetrahydrofuran.

[Synthesis Process 2]

A silicon-containing polymer precursor-2 was synthesized in the same synthesis process as synthesis process 2 included in the foregoing synthetic method for the silicon-containing curable composition-A. That is, 90 parts of dichlorodimethylsilane and 9 parts of dichlorodiphenylsilane were mixed together and then the mixture was added dropwise to a mixed solvent composed of 100 parts of ion-exchange water and 100 parts of toluene. Then the aqueous phase was removed from the reaction liquid, following which the liquid mixture was polymerized at 250° C. for 2 hours while distilling the toluene solvent away therefrom. To the resulting reaction solution, 20 parts of pyridine was added, 20 parts of dimethyldichlorosilane was further added thereto, and then the solution was stirred for 30 minutes. Thereafter, the reaction solution was heated at 250° C. under reduced pressure to remove the low molecular weight components and pyridine hydrochloride, giving a silicon-containing polymer precursor-2. The analysis of the silicon-containing polymer precursor-2 by GPC showed that its molecular weight Mw is 50,000.

[Synthesis Process 3]

A silicon-containing polymer precursor-3 was synthetically prepared in the same synthesis process as synthesis process 3 included in the foregoing synthetic method for the silicon-containing curable composition-A. That is, 5 parts of the silicon-containing polymer precursor-1 prepared in synthesis process 1, 10 parts of pyridine, and 1.5 parts of trimethylchlorosilane were added to a toluene solvent and then the mixture was stirred at room temperature for 30 minutes. To the mixture, 100 parts of the silicon-containing polymer precursor-2 prepared in synthesis process 2 was added and the resulting mixture was copolymerized for 4 hours with stirring, following which the reaction was stopped by adding ion-exchange water thereto. Thereafter, pyridine hydrochloride was removed therefrom by washing with water to give a silicon-containing polymer precursor-3. The analysis of the silicon-containing polymer precursor-3 by GPC showed that its molecular weight Mw is 92,000.

[Synthesis Process 4]

50 parts of the silicon-containing polymer precursor-3 prepared in synthesis process 3 and 5 parts of pyridine were added to a toluene solvent. To the above mixture, a mixture of 5 parts of dimethylchlorosilane and 5 parts of dimethylvinylchlorosilane was further added and the resulting mixture was stirred at room temperature for 30 minutes and further stirred at 70° C. for 30 minutes. Thereafter, pyridine hydrochloride was removed from the mixture by washing with ion-exchange water, giving a silicon-containing polymer-6 as component (C). The silicon-containing polymer-6 had a molecular weight Mw of 92,000, the content of aryl groups was found to be 8.4 wt % from $H^1$-NMR and GPC analyses, and components having weight-average molecular weights of not more than 1,000 were not included.

[Synthesis Process 5]

70 parts of the silicon-containing polymer-6, 30 parts of fine silicon dioxide powder as component (E), and 0.005 parts of a platinum-carbonylvinylmethyl complex as component (D) acting as a curing catalyst were mixed together to give the silicon-containing curable composition-C.

The viscosity of the silicon-containing curable composition-C prepared in synthesis processes 1 to 5 was measured at 25° C. (room temperature) by using a E-type viscometer and the measurement showed that the composition-C has a viscosity of 16 Pa·S and thus has good fluidity. Therefore, when applied, the composition-C accumulated into the shape of a mountain and hence, it was found to be excellent in handling quality.

Next, the SiC photodiode 52 fabricated in advance is soldered to the inner surface of the metal cap 70 via the aluminum nitride insulating plate 71 by using high-melting solder of gold silicon. Then the 80-μm-diameter gold lead wire 73 is connected between the anode electrode 72 and the anode terminal 74 by using a lead bonding apparatus Also, the gold lead wire 76 is connected between the cathode electrode 75 and the cathode terminal 77. Then the silicon-containing curable composition-C is thickly applied so as to cover the SiC photodiode 52, the junctions of the SiC photodiode 52 and the lead wires 73 and 76, and the vicinities of the junctions. The silicon-containing curable composition-C has good fluidity at room temperature (25° C.); when applied thereto, the composition-C accumulates into the shape of a mountain. Finally, the package is formed by coupling the metal cap 70 and the support 67 together in a state that the light-receiving portion 80 of the SiC photodiode 52 is opposite to the light-emitting aperture 60 of the GaN-npn bipolar transistor 51 and the top of the mountain-shaped silicon-containing curable composition-C covering the photodiode 52 and the top of the mountain-shaped composition-C covering the transistor 51 are in contact with each other and by welding the metal cap 70 and the support 67 together in a nitrogen atmosphere. Thereafter, the package is heated to a predetermined temperature of about 200° C. so that the silicon-containing curable composition-C is cured with its flexibility secured to some extent, by which the coverture 81 is formed. By using the processes described above, the fabrication of the photocoupled wide gap power semiconductor device according to the embodiment is completed.

The following is an example of the operation of the photocoupled wide gap power semiconductor device according to the third embodiment. To begin with, the potential of the collector terminal 68 of the GaN-npn bipolar transistor 51 is made higher than that of the emitter terminal 65 to bring up the state of a forward bias. Then the potential of the base terminal 62 is made equal to that of the emitter terminal 65, thereby an OFF state in which no current flows is maintained. The device has a withstand voltage above 2.5 kV, and therefore a high withstand voltage has been achieved. The SiC photodiode 52 is brought to the state of a reverse bias by making the potential of the anode terminal 74 lower than that of the cathode terminal 77.

On-off action is produced as described below. The potential of the base terminal 62 is made higher than that of the emitter terminal 65 to pass a base current from the base terminal 62 to the emitter terminal 65. As a result, electrons are injected from the emitter electrode 59, the GaN-npn bipolar transistor 51 is turned on, and light 50 with a wavelength of about 390 to 570 nm is emitted. The SiC photodiode 52 receives the light 50 and then a photo current, whose amount corresponds to that of the light 50, flows between the anode terminal 74 and the cathode terminal 77.

By making the potential of the base terminal 62 equal to or lower than that of the emitter terminal 65 when the GaN-npn bipolar transistor 51 is in the ON state, the injection of the electrons is stopped. As a consequence, a current flowing between the collector electrode 66 and the emitter electrode 59 is interrupted and the emission of the light 50 is also stopped. Because of this, no photo current is produced, and therefore the SiC photodiode 52 is turned off.

In the photocoupled wide gap power semiconductor device according to the embodiment, a current flowing through the GaN-npn bipolar transistor 51 can be detected based on a photo current produced at the SiC photodiode 52. Since a voltage between the anode terminal 74 and the cathode terminal 77 of the SiC photodiode 52 is relatively low, the operating state of the GaN-npn bipolar transistor 51 to which a high voltage of several kilovolts is applied can be detected by using a low-voltage measuring unit (such as a voltmeter or a voltage measuring circuit).

The GaN-npn bipolar transistor 51 according to the embodiment had a withstand voltage of about 3.1 kV and it was possible to maintain such a withstand voltage even at a high temperature of 250° C. When a reverse voltage of 2.5 kV was applied thereto, the density of leakage current was as good as not more than $4\times10^{-4}$ A/cm$^2$. Further, a dielectric strength voltage between the GaN-npn bipolar transistor 51 and the SiC photodiode 52 is above 5 kV and the density of the leakage current produced at the dielectric strength voltage of 5 kV was below $1\times10^{-5}$ A/cm$^2$. Even after a 1000-hours continuous-voltage-application test was conducted at a temperature of 250° C., an increase in the leakage current took on a very small value which falls within the range of a measurement error. In the photocoupled wide gap power semiconductor device according to the embodiment, it was possible to pass current therethrough at a high current density of 150 A/cm$^2$ despite the high withstand voltage above 2.5 kV. Furthermore, even after current was continuously passed therethrough for 600 hours in a high-temperature atmosphere of 200° C., deformation, crack, and cloudiness did not occur in the coverture 81 made of the synthetic high molecular compound. Moreover, even after current was passed therethrough for 250 hours in an atmosphere of a high temperature of 80° C. and a high humidity of 85%, deformation, crack, and cloudiness did not occur in the coverture 81 made of the synthetic high molecular compound. When current was passed therethrough at a current density of 150 A/cm$^2$ and a temperature of 200° C., forward voltage was 5.1 V and a change in the forward voltage before and after the test took on a small value which falls within the range of a measurement error. When a conduction voltage of 2.5 kV was applied thereto after the above test, the leakage current density was below $5\times10^{-4}$ A/cm$^2$ at a temperature of 250° C., and therefore there was little change in the density before and after the test. It was shown by a rupture test that the coverture 81 made of the synthetic high molecular compound firmly adheres to the GaN exposed at the side of the GaN-npn bipolar transistor 51 as well. Incidentally, a turn-on time was as short as 0.08 μs and a turn-off time was as short as 0.14 μs; there was also no change in the switching times before and after the test.

In addition to the above description about the three embodiments, the present invention is intended to cover wider applicability or more derived structures. For example, the invention is also applicable to MOSFET, junction FET, SIT, IGBT, MOS thyristors, etc. of Si semiconductors and wide gap semiconductors. And further, the invention is also applicable to high-frequency high-power MESFET, lateral MOSFET, junction FET, HEMT, and so on.

In the embodiments described above, only the description about the elements and light-receiving element made of SiC or GaN has been presented, while the invention is also applicable to elements made of other wide gap semiconductor materials or compound semiconductors. In particular, the invention is also effectively applicable to elements made of diamond or gallium phosphide wide gap semiconductor materials.

Moreover, the invention is also naturally applicable to semiconductor devices fabricated by interchanging the n-type and p-type polarities of the individual semiconductor regions.

In the first and second embodiments, the description about the semiconductor devices provided with the TO-type packages using the metal cap 43 and 70 has been presented; the invention is also applicable to semiconductor devices having high-heat-resistant resin caps instead of the metal caps. Moreover, as the structures of semiconductor devices, a stud-type structure, a flat-type structure, a SIP-type structure where high-heat-resistant resin is used, and a mold-type structure generally used for Si power modules can be used instead of the TO-type structure. The packages of FIGS. 1 and 2 each houses one semiconductor element, while the semiconductor element can be plurally housed in each package. When the plural semiconductor elements are housed in each package, it is preferable that the semiconductor elements be each covered with the coverture made of the synthetic high molecular compound; when the potential difference between the semiconductor elements is not so large, the plural semiconductor elements can be covered with one coverture. In the third embodiment, the photocoupled semiconductor device has been exemplified, while the invention is also similarly applicable to semiconductor devices each having only a light-emitting semiconductor element or semiconductor devices each having only a light-receiving semiconductor element. And furthermore, it is needless to say that the invention is also applicable to electric power units, such as transformers, contactors, and switchers, requiring high heat resistance and high withstand voltage characteristics, other than semiconductor devices.

The invention claimed is:

1. A semiconductor device characterized in that
at least one semiconductor element is provided,
the semiconductor elements and at least a part of electrical connecting portions for use in electrically connecting the semiconductor elements to external devices are covered with a synthetic high molecular weight compound,
the synthetic high molecular weight compound is a cured product obtained by heat-curing a silicon-containing curable composition which contains silicon-containing polymers as components (A), (B), and (C) described below and a catalyst as component (D) described below,
component (A) is a silicon-containing polymer which has one or more reactive groups (A') selected from the group consisting of the formulas $Si-R^1$, $Si-O-R^2$, and $Si-R^3-OCOC(R^4)=CH_2$ and has bridged structures formed by $Si-O-Si$ bonds at one location or more, wherein greater than 80 wt % of the molecules of component (A) have a molecular weight of greater than 1,000 [$R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group],
component (B) is a silicon-containing polymer which has $Si-H$ groups and has bridged structures formed by $Si-O-Si$ bonds at one location or more, wherein greater than 80 wt % of the molecules of component (B) have a molecular weight of greater than 1,000,
component (C) is a silicon-containing polymer which has one or more reactive groups (A') selected from the group consisting of the formulas $Si-R^1$, $Si-O-R^2$, and $S^1-R^3-OCOC(R^4)=CH_2$, has $Si-H$ groups, and has bridged structures formed by $Si-O-Si$ bonds at one location or more, and wherein greater than 80 wt % of the molecules of component (C) have a molecular weight of greater than 1,000, and
component (D) is a curing catalyst which is a platinum catalyst.

2. The semiconductor device according claim 1 characterized in that the total content of the alkylene groups and arylene groups of components (A), (B), and (C) contained in the silicon-containing curable composition as the synthetic high molecular weight compound is 0.1 to 50 wt %.

3. The semiconductor device according to claim 1 characterized in that the silicon-containing curable composition as the synthetic high molecular weight compound further contains a fine metal oxide powder as component (E).

4. The semiconductor device according to claim 3 characterized in that the metal oxide contained in the silicon-containing curable composition is the oxide of at least one metal selected from the group consisting of aluminum (Al), barium (Ba), calcium (Ca), iron (Fe), potassium (K), lithium (Li), zinc (Zn), magnesium (Mg), sodium (Na), and silicon (Si).

5. The semiconductor device according claim 1 characterized in that the semiconductor element is a SiC semiconductor element using SiC as a wide gap semiconductor or a GaN semiconductor element using GaN as wide gap semiconductor.

6. The semiconductor device according to claim 1 characterized in that the semiconductor element has a wide gap semiconductor light-receiving element and/or a wide gap semiconductor light-emitting element.

7. A semiconductor device characterized in that
at least one semiconductor element is provided,
the semiconductor elements and at least a part of electrical connecting portions for use in electrically connecting the semiconductor elements to external devices are covered with a synthetic high molecular weight compound,
the synthetic high molecular weight compound is a cured product obtained by heat-curing a silicon-containing curable composition which contains silicon-containing polymers as components (A) and (B) described below and a catalyst as component (D) described below,
component (A) is a silicon-containing polymer which has one or more reactive groups (A') selected from the group consisting of the formulas $Si-R^1$, $Si-O-R^2$, and $S^1-R^3-OCOC(R^4)=CH_2$ and has bridged structures formed by $Si-O-Si$ bonds at one location or more, wherein greater than 80 wt % of the molecules of component (A) have a molecular weight of greater than 1,000 [$R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group],
component (B) is a silicon-containing polymer which has $Si-H$ groups and has bridged structures formed by $Si-O-Si$ bonds at one location or more, wherein greater than 80 wt % of the molecules of component (B) have a molecular weight of greater than 1,000, and
component (D) is a curing catalyst which is a platinum catalyst.

8. The semiconductor device according to claim 7 characterized in that in the silicon-containing curable composition as the synthetic high molecular weight compound, the ratio of the total content of the alkylene groups and arylene groups of component (A) to the total content of the alkylene groups and arylene groups of component (B) is 0.5 to 1.5:0.5 to 1.5 in a weight ratio.

9. A semiconductor device characterized in that
  at least one semiconductor element is provided,
  the semiconductor elements and at least a part of electrical connecting portions for use in electrically connecting the semiconductor elements to external devices are covered with a synthetic high molecular weight compound,
  - the synthetic high molecular weight compound is a cured product obtained by heat-curing a silicon-containing curable composition which contains a silicon-containing polymer as either component (A) or component (B) described below, a silicon-containing polymer as component (C) described below, and a catalyst as component (D) described below,
  - component (A) is a silicon-containing polymer which has one or more reactive groups (A') selected from the group consisting of the formulas Si—$R^1$, Si—O—$R^2$, and Si—$R^3$—OCOC($R^4$)=$CH_2$ and has bridged structures formed by Si—O—Si bonds at one location or more, wherein greater than 80 wt % of the molecules of component (A) have a molecular weight of greater than 1,000 [$R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group],
  - component (B) is a silicon-containing polymer which has Si—H groups and has bridged structures formed by Si—O—Si bonds at one location or more, wherein greater than 80 wt % of the molecules of component (B) have a molecular weight of greater than 1,000,
  - component (C) is a silicon-containing polymer which has one or more reactive groups (A') selected from the group consisting of the formulas Si—$R^1$, Si—O—$R^2$, and Si—$R^3$—OCOC($R^4$)=$CH_2$, has Si—H groups, and has bridged structures formed by Si—O—Si bonds at one location or more, wherein greater than 80 wt % of the molecules of component (C) have a molecular weight of greater than 1,000, and
  - component (D) is a curing catalyst which is a platinum catalyst.

10. A semiconductor device characterized in that
  at least one semiconductor element is provided,
  the semiconductor elements and at least a part of electrical connecting portions for use in electrically connecting the semiconductor elements to external devices are covered with a synthetic high molecular weight compound,
  - the synthetic high molecular weight compound is a cured product obtained by heat-curing a silicon-containing curable composition which contains a silicon-containing polymer as component (C) described below and a catalyst as component (D) described below,
  - component (C) is a silicon-containing polymer which has one or more reactive groups (A') selected from the group consisting of the formula Si—$R^1$, Si—O—$R^2$, and Si—$R^3$—OCOC($R^4$)=$CH_2$, has Si—H groups, and has bridged structures formed by Si—O—Si bonds at one location or more, wherein greater than 80 wt % of the molecules of component (C) have a molecular weight of greater than 1,000 [$R^1$ and $R^2$ are each a $C_2$ to $C_{20}$ alkenyl group which may contain an alkylene group and/or an arylene group, $R^3$ is a $C_1$ to $C_9$ alkylene group and/or a $C_1$ to $C_9$ arylene group, and $R^4$ is a hydrogen atom or a methyl group, and
  - component (D) is a curing catalyst which is a platinum catalyst.

* * * * *